（12） United States Patent
Tamura et al.

(10) Patent No.: US 6,812,777 B2
(45) Date of Patent: Nov. 2, 2004

(54) OUTPUT CIRCUIT DEVICE FOR CLOCK SIGNAL DISTRIBUTION IN HIGH-SPEED SIGNAL TRANSMISSION

(75) Inventors: Hirotaka Tamura, Kawasaki (JP); Masaya Kibune, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/328,002

(22) Filed: Dec. 26, 2002

(65) Prior Publication Data

US 2003/0222705 A1 Dec. 4, 2003

(30) Foreign Application Priority Data

May 28, 2002 (JP) .................................. 2002-153885

(51) Int. Cl.[7] .............................................. G05F 1/10
(52) U.S. Cl. ...................................................... 327/540
(58) Field of Search ................................ 327/530, 534, 327/535, 538, 540, 541, 551, 552, 558, 559

(56) References Cited

U.S. PATENT DOCUMENTS

| 5,739,681 | A  | * | 4/1998  | Allman ........................ 323/314 |
| 5,883,537 | A  | * | 3/1999  | Luoni et al. ................. 327/318 |
| 6,472,929 | B2 | * | 10/2002 | Kobayashi et al. .......... 327/540 |
| 6,509,727 | B2 | * | 1/2003  | Fahrenbruch ................ 323/316 |
| 6,677,809 | B2 | * | 1/2004  | Perque et al. ............... 327/541 |

* cited by examiner

Primary Examiner—Jeffrey Zweizig
(74) Attorney, Agent, or Firm—Arent Fox PLLC

(57) ABSTRACT

An output circuit device has an output circuit connected between a first power supply line and a second power supply line via a control circuit having at least one isolating transistor. A control voltage held at a constant level is applied to a control electrode of the isolating transistor, and the control voltage is a voltage at a level that works to attenuate high-frequency components contained in a voltage supplied from the first or the second power supply line.

24 Claims, 18 Drawing Sheets

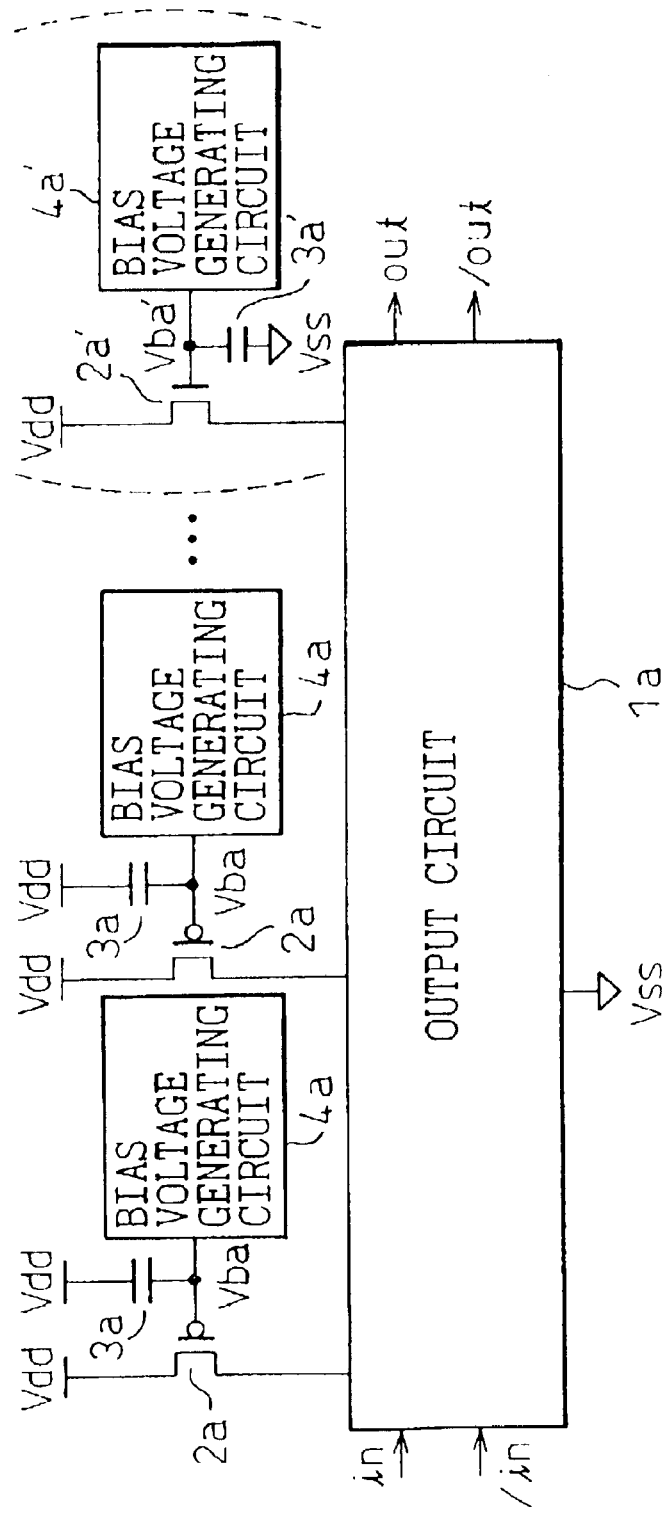

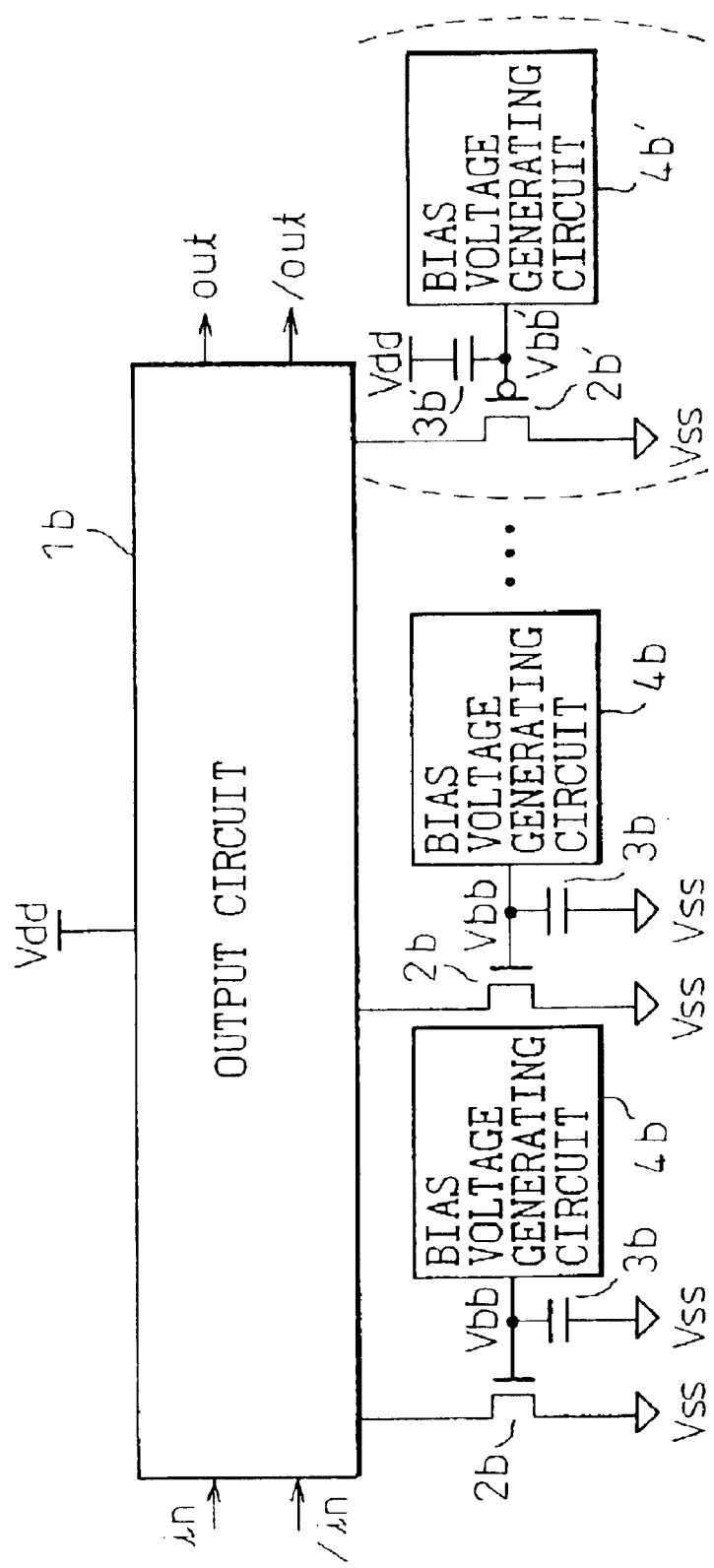

OUTPUT CIRCUIT DEVICE FOR CLOCK SIGNAL DISTRIBUTION IN HIGH-SPEED SIGNAL TRANSMISSION

CROSS REFERENCE TO RELATED APPLICATION

This application is based upon and claims the benefit of priority from the prior Japanese Patent Application No. 2002-153885, filed on May 28, 2002, the entire contents of which are incorporated herein by reference.

BACKGROUND OF THE INVENTION

1. Field of the Invention

The present invention relates to a signal transmission technology for enabling high-speed signal transmission between a plurality of LSI chips or a plurality of devices or circuit blocks within a single chip, or between a plurality of boards or cabinets, and more particularly to an output circuit device to be used for clock signal distribution in high-speed signal transmission, and a system constructed with such output circuit devices.

2. Description of the Related Art

Recently, the performance of components used in computers and other information processing apparatuses has been greatly improved. In particular, dramatic improvements have been made, for example, in the performance of processors and semiconductor memory devices such as SRAMs (Static Random Access Memories) and DRAMs (Dynamic Random Access Memories). The improvements in the performance of semiconductor memory devices, processors, etc. have reached the point where system performance cannot be improved further unless the speed of signal transmission between components or elements is increased.

Specifically, the speed gap between a memory such as a SRAM or DRAM and a processor (i.e., between LSIS), for example, has been widening, and in recent years, this speed gap has been becoming a bottleneck in a computer's performance. Further, not only the speed of signal transmission between such chips, but because of increasing integration and increasing size of chips, decreasing supply voltage levels (decreasing signal amplitude levels), etc. the speed of signal transmission between elements or circuit blocks within a single chip is also becoming a major factor limiting the performance of the chip. Moreover, the speed of signal transmission between a peripheral device and the processor/chipset also is becoming a major factor limiting the overall performance of the system.

Here, a technique for distributing a clock for accurate timing becomes important when it comes to increasing the speed of signal transmission within a cabinet or between circuit blocks or chips. That is, as the timing accuracy of the distributed clock directly affects the accuracy of receive timing and also the timing accuracy of a signal to be generated, a buffer that can minimize the occurrence of jitter must be used as a clock buffer for clock distribution. This applies not only to the clock distribution buffer, but also to various other output circuit devices that are required to operate at high speed with accurate timing.

In the prior art, it was difficult to provide an output circuit device that can operate at high speed with accurate timing by minimizing the occurrence of jitter.

The prior art and its associated problem will be described in detail later with reference to relevant drawings.

SUMMARY OF THE INVENTION

An object of the present invention is to provide an output circuit device that can operate at high speed with accurate timing by minimizing the occurrence of jitter.

According to the present invention, there is provided an output circuit device comprising an output circuit connected between a first power supply line and a second power supply line via a control circuit having at least one isolating transistor, wherein a control voltage held at a constant level is applied to a control electrode of the isolating transistor, and the control voltage is a voltage at a level that works to attenuate high-frequency components contained in a voltage supplied from the first or the second power supply line.

Further, according to the present invention, there is also provided an output circuit system having a plurality of output circuit devices, multi-phase clocks being transmitted through the plurality of output circuit devices, and phase spacing between multiple phases being maintained constant by adjusting the amount of delay in each of the output circuit devices in accordance with an output of a uniformity detection circuit that detects phase uniformity between the multi-phase clocks, wherein each of the output circuit devices comprises an output circuit connected between a first power supply line and a second power supply line via a control circuit having at least one isolating transistor, wherein a control voltage held at a constant level is applied to a control electrode of the isolating transistor, and the control voltage is a voltage at a level that works to attenuate high-frequency components contained in a voltage supplied from the first or the second power supply line.

The control circuit may comprise a high-frequency component attenuating capacitor one end of which is connected to the control electrode of the isolating transistor. The isolating transistor may be a source-grounded MOS transistor, and the other end of the high-frequency component attenuating capacitor may be connected to a source side of the first or the second power supply line whichever is connected to the source-grounded MOS transistor. The isolating transistor may be a pMOS transistor whose source is connected to the first power supply line, and whose drain is connected to the output circuit, and the other end of the high-frequency component attenuating capacitor may be connected to the first power supply line. The isolating transistor may be an nMOS transistor whose source is connected to the second power supply line, and whose drain is connected to the output circuit, and the other end of the high-frequency component attenuating capacitor may be connected to the second power supply line.

The isolating transistor may be a source-follower connected MOS transistor, and the other end of the high-frequency component attenuating capacitor may be connected either to the first or the second power supply line whichever is not connected to the source-follower connected MOS transistor, or to a node having a prescribed potential difference relative to the power supply line not connected to the source-follower connected MOS transistor. The isolating transistor may be an nMOS transistor whose source is connected to the output circuit, and whose drain is connected to the first power supply line, and the other end of the high-frequency component attenuating capacitor may be connected to the second power supply line. The isolating transistor may be a pMOS transistor whose source is connected to the output circuit, and whose drain is connected to the second power supply line, and the other end of the high-frequency component attenuating capacitor may be connected to the first power supply line.

The control voltage may be generated through a noise reduction filter circuit, and the noise reduction filter circuit may attenuate the high-frequency components contained in the voltage supplied from the first or the second power supply line whichever is connected to the isolating MOS transistor. The output circuit may comprise a pair of inverters amplifying differential signals, and a voltage passed through the control circuit may be applied to a back gate of a transistor forming each of the inverters. A well of each pMOS transistor forming the pair of inverters may be connected to the source of the pMOS transistor.

The isolating transistor may be provided on at least one side, either between the output circuit and the first power supply line, or between the output circuit and the second power supply line. The isolating transistor may be provided on both sides, both between the output circuit and the first power supply line and between the output circuit and the second power supply line.

The output circuit device may further comprise a low-pass filter circuit provided in series to the isolating transistor. The low-pass filter circuit may comprise a filter transistor connected in series between the isolating transistor and the first or the second power supply line; and a filter capacitor one end of which is connected to a connection node between the isolating transistor and the filter transistor. A potential on the first or the second power supply line, whichever is not connected to the filter transistor, may be applied to a control electrode of the filter transistor as well as to the other end of the filter capacitor.

The low-pass filter circuit may comprise a filter resistor connected in series between the isolating transistor and the first or the second power supply line; and a filter capacitor one end of which is connected to a connection node between the isolating transistor and the filter resistor. A potential on the first or the second power supply line, whichever is not connected to the filter resistor, may be applied to the other end of the filter capacitor.

According to the present invention, there is provided an output circuit device comprising an amplifier circuit to which an input signal is supplied, wherein a common-mode voltage of the input signal is adjusted to a value substantially equal to a common-mode voltage of an output signal output from the amplifier circuit.

Further, according to the present invention, there is also provided an output circuit system having a plurality of output circuit devices, multi-phase clocks being transmitted through the plurality of output circuit devices, and phase spacing between multiple phases being maintained constant by adjusting the amount of delay in each of the output circuit devices in accordance with an output of a uniformity detection circuit that detects phase uniformity between the multi-phase clocks, wherein each of the output circuit devices comprises an amplifier circuit to which an input signal is supplied, wherein a common-mode voltage of the input signal is adjusted to a value substantially equal to a common-mode voltage of an output signal output from the amplifier circuit.

The adjustment of the common-mode voltage of the input signal may be performed by a common-mode feedback circuit provided on an output side of a transmitting circuit that transmits signals to the output circuit device. The adjustment of the common-mode voltage of the input signal may be performed by terminating the input signal with a power supply that is provided on an input side of the output circuit device and that generates a common-mode voltage of a prescribed level. The adjustment of the common-mode voltage of the input signal may be performed by capacitively coupling the input signal with the amplifier circuit and by supplying a DC potential, after the capacitively coupling, to a power supply that is provided on an input side of the output circuit device and that generates a common-mode voltage of a prescribed level.

The output circuit device may further comprise a duty detection circuit detecting an output duty of the output circuit; and a duty adjusting circuit adjusting the output duty of the output circuit in accordance with the detected duty, and wherein the ratio of the output duty is controlled to approximately 50%. The output circuit device may be a clock buffer used for clock signal distribution.

BRIEF DESCRIPTION OF THE DRAWINGS

The present invention will be more clearly understood from the description of the preferred embodiments as set forth below with reference to the accompanying drawings, wherein:

FIGS. 3A and 3B are block circuit diagrams (part 1) schematically showing the basic functional configuration of an output circuit device according to the present invention;

DESCRIPTION OF THE PREFERRED EMBODIMENTS

Before proceeding to the detailed description of the preferred embodiments of the output circuit device according to the present invention, a prior art output circuit device and its associated problem will be described with reference to the drawings.

Figure 1:
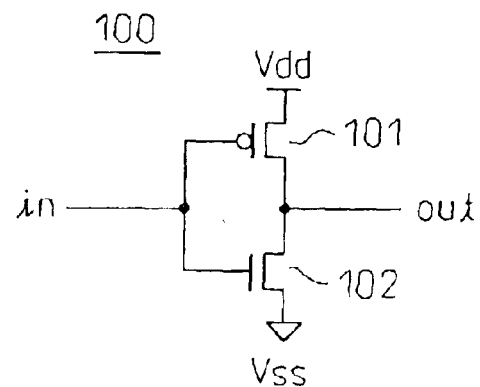
FIG. 1 is a circuit diagram showing one example of a prior art output circuit device.

FIG. 1 is a circuit diagram showing one example of the prior art output circuit device.

In the prior art, a clock buffer (output circuit device) formed within an integrated circuit and, for example, is usually constructed using a full-swing output type inverter.

That is, as shown in FIG. 1, the prior art output circuit device is constructed from a CMOS (Complementary MOS) inverter 100 comprising, for example, an nMOS (n-channel type MOS) transistor 102 and a pMOS (p-channel type MOS) transistor 101. This type of CMOS inverter 100 has the advantages that direct-current consumption is low, that high speed operation is possible, and that a large-amplitude output can be obtained as the output voltage is caused to swing fully between a high-level supply voltage Vdd (for example, 1.2 V) and a low-level supply voltage Vss (for example, 0 V).

Figure 2:
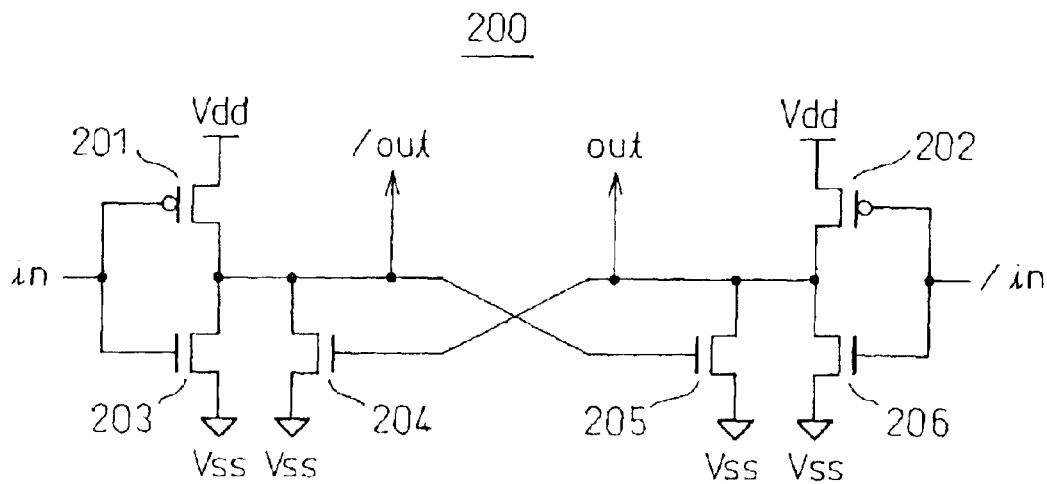
FIG. 2 is a circuit diagram showing another example of the prior art output circuit device.

FIG. 2 is a circuit diagram showing another example of the prior art output circuit device, which is designed to process differential (complementary) signals. That is, in high-speed signal transmission, differential clock transmission is often used, and the example shown in FIG. 2 concerns a clock buffer (output circuit device) for such differential clocks.

As shown in FIG. 2, the prior art output circuit device for differential clocks comprises two CMOS inverters 201, 203 and 202, 206, at which differential input clocks (input signals) in and /in, for example, are received, and cross-coupled nMOS transistors 204 and 205 provided in parallel with the nMOS transistors 203 and 206 in the respective CMOS inverters. Here, differential output clocks (output signals) out and /out are derived in the form of the outputs of the inverters 202, 206 and 201, 203 respectively supplied with the input clocks /in and in.

It is known that the output circuit device shown in FIG. 2 improves the balance of differential signal operation, because the cross-coupled nMOS transistors 204 and 205 operate in such a manner as to cause one of the differential output signals (input signals) to go to a high level "H" when the other goes to a low level "L" and vice versa.

In the prior art output circuit devices shown in FIGS. 1 and 2 above, if the delay changes due to dynamic variation of the supply voltage (for example, high-level supply voltage Vdd), jitter is introduced in the clock signal. Furthermore, if the duty (duty cycle) of the clock signal is displaced from 50% for some reason, the displacement of the duty becomes larger as the clock signal propagates through a plurality of clock buffer stages, and eventually, one or the other of the clock pulses (high level "H" pulse or low level "L" pulse), whichever is diminishing in width, will disappear.

As the application of the output circuit device shown in FIG. 1 or 2 is not limited to a clock buffer for clock signal distribution, the above deficiency becomes a problem in various other applications of the output circuit device. The output circuit device of the present invention also is not limited in application to a clock buffer, but can be applied extensively to various output circuit devices such as a buffer, driver, etc. used for signal transmission between a plurality of LSI chips or a plurality of devices or circuit blocks within a single chip or between a plurality of boards or cabinets.

Next, the basic functional configuration of the output circuit device according to the present invention will be described.

FIGS. 3A and 3B are block circuit diagrams (part 1) schematically showing the basic functional configuration of the output circuit device according to the present invention. In the configuration shown in FIG. 3A, an isolating transistor is inserted between the high-level power supply line (Vdd) and output circuit (1a), while in FIG. 3B, the isolating transistor is inserted between the low-level power supply line (Vss) and output circuit (1b).

In FIG. 3A, reference numeral 1a is the output circuit (clock buffer circuit proper), 2a and 2a' are isolating transistors, 3a and 3a' are capacitors (high-frequency component attenuating capacitors), and 4a and 4a' are bias voltage generating circuits.

As shown in FIG. 3A, in the output circuit device according to the present invention, the pMOS transistor 2a (or the nMOS transistor 2a') is inserted between the high-level power supply line (Vdd) and the output circuit 1a, and a constant-level control voltage (bias voltage) output from the bias voltage generating circuit 4a (4a') is applied to the gate of the transistor. Here, the high-level supply voltage Vdd is, for example, 1.2 V, and the low-level supply voltage Vss is, for example, 0 V.

The pMOS transistor (source-grounded pMOS transistor) 2a, whose source is connected to the high-level power supply line, is supplied at its gate with a control voltage (bias voltage Vba), for example, of 1.0 V substantially equal to the drain potential, and functions as a current source. At this time, the capacitor 3a, one terminal of which is connected to the gate of the pMOS transistor 2a, has its other terminal connected to the high-level power supply line (Vdd), and the high-frequency noise occurring in the potential difference between the gate of the transistor 2a and the high-level supply voltage Vdd isolated by the transistor 2a is reduced by a noise reduction filter circuit formed from the capacitor 3a.

On the other hand, the nMOS transistor (source-follower connected nMOS transistor) 2a', whose drain is connected to the high-level power supply line, is supplied at its gate with a control voltage (bias voltage Vba') of a voltage level (for example, 1.0 V or 1.2 V) higher than the source potential by a value not smaller than the threshold voltage of that transistor, and isolates an internal circuit from the high-level power supply line. At this time, the capacitor 3a', one terminal of which is connected to the gate of the nMOS transistor 2a', has its other terminal connected to the low-level power supply line (Vss), and the high-frequency noise occurring in the potential difference between the gate of the transistor 2a' and the low-level supply voltage Vss on the side not isolated by the transistor 2a' is reduced by the capacitor 3a'.

In this way, in the output circuit 1a, high-frequency components contained in the high-level supply voltage Vdd on the side isolated by the transistors 2a and 2a' can be attenuated. Here, the isolating transistor between the high-level power supply line and the output circuit 1a can be inserted as needed by selecting either the pMOS transistor 2a or the nMOS transistor 2a'. Further, the bias voltage generating circuits 4a and 4a' can each be configured, for example, as a circuit that will be described later with reference to FIG. 10.

In FIG. 3B, reference numeral 1b is the output circuit, 2b and 2b' are isolating transistors, 3b and 3b' are capacitors (high-frequency component attenuating capacitors), and 4b and 4b' are bias voltage generating circuits.

As is apparent from a comparison between FIG. 3B and FIG. 3A, in the output circuit device according to the present invention, the isolating transistors 2b and 2b' can be inserted between the output circuit 1b and the low-level power supply line (Vss), rather than inserting the isolating transistors 2a and 2a' between the output circuit 1a and the high-level power supply line (Vdd) as shown in FIG. 3A above.

That is, in the output circuit device shown in FIG. 3B, the nMOS transistor 2b (or the pMOS transistor 2b') is inserted between the low-level power supply line (Vss) and the output circuit 1b, and a constant-level control voltage (bias voltage Vbb, (Vbb')) output from the bias voltage generating circuit 4b (4b') is applied to the gate of the transistor.

The nMOS transistor (source-grounded nMOS transistor) 2b, whose source is connected to the low-level power supply line, functions as a current source, and the capacitor 3b, one terminal of which is connected to the gate of the nMOS transistor 2b, has its other terminal connected to the low-level power supply line (Vss). The high-frequency noise occurring in the potential difference between the gate of the transistor 2b and the low-level supply voltage Vss isolated by the transistor 2b is reduced by a noise reduction filter circuit formed from the capacitor 3b.

On the other hand, the pMOS transistor (source-follower pMOS transistor) 2b', whose drain is connected to the low-level power supply line, isolates an internal circuit from the high-level power supply line, and the capacitor 3b', one terminal of which is connected to the gate of the pMOS transistor 2b', has its other terminal connected to the high-level power supply line (Vdd); here, the high-frequency noise occurring in the potential difference between the gate of the transistor 2b' and the high-level supply voltage Vdd on the side not isolated by the transistor 2b' is reduced by a noise reduction filter circuit formed from the capacitor 3b'.

In this way, in the output circuit 1b, high-frequency components contained in the low-level supply voltage Vss on the side isolated by the transistors 2b and 2b' can be attenuated.

As shown in FIGS. 3A and 3B, the transistors 2a, 2a' or 2b, 2b' are inserted between the power supply line to be isolated and the circuit proper (output circuit 1a or 1b) in order to isolate the operation of the circuit proper from supply voltage variations. These transistors are source-grounded or source-follower connected; in the case of the source-grounded configuration, the high-frequency noise occurring in the potential difference between the gate and the power supply line on the isolated side is reduced while, in the case of the source follower configuration, the gate voltage is generated through the filter circuit (the capacitor 3a, 3a' or 3b, 3b') that works to attenuate the high-frequency components of the voltage between the gate and the power supply line on the non-isolated side.

In this way, if noise occurs on the power supply line (supply voltage) on the isolated side, as the power supply noise is attenuated by the source-grounded (2a, 2b) or source-follower connected (2a', 2b') transistors, the effect of the power supply noise on the circuit proper (1a, 1b) can be reduced.

However, when an isolating transistor is inserted between the power supply line and the circuit proper, the effect of the power supply variation can be reduced but, as the variation cannot be eliminated completely, jitter due to the power supply noise may not be reduced sufficiently. This is because the output common mode varies due to the effect of the residual power supply noise and, when it is propagated to the clock buffer at the next stage, the common mode variation is amplified, further increasing the amount of jitter and thus resulting in the occurrence of jitter large enough to become a problem.

Figure 4:
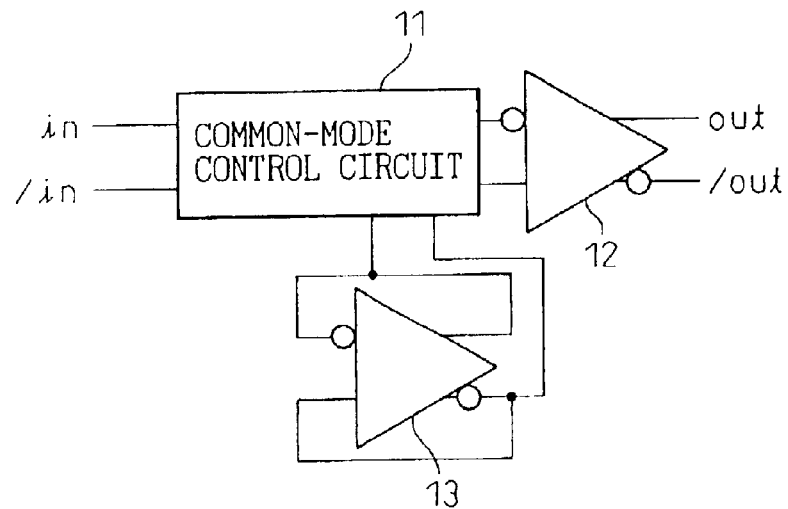
FIG. 4 is a block circuit diagram showing one example of an output circuit in the output circuit devices of FIGS. 3A and 3B.

FIG. 4 is a block circuit diagram showing one example of the output circuit in the output circuit devices of FIGS. 3A and 3B, which is designed to reduce jitter by controlling the common mode.

As shown in FIG. 4, the output circuit 1 comprises a common-mode control circuit 11 and buffers 12 and 13. The common-mode control circuit 11 and the buffer 13 together function to cause the input common-mode voltage to coincide with the output common-mode voltage, and the outputs of the common-mode control circuit 11 are output via the buffer 12.

That is, the effect of the residual power supply variation described above can be reduced to a minimum by causing the common-mode voltage of the signals input to the circuit proper (output circuit 1a, 1b) to coincide with the steady-state common-mode voltage obtained in a condition where the effect of the power supply variation is reduced by isolation (that is, the voltage such that the common-mode voltage of the input signals in and /in equals the common-mode voltage of the output signals out and /out). To make the common-mode voltage of the input signals coincide with the steady-state common-mode voltage, the common-mode voltage of the input signals is terminated or fed back so that the voltage can be maintained at an ideal value.

Further, the earlier described problem of the duty being displaced and eventually causing a pulse signal to be disappeared can be solved by using a feedback circuit that detects the duty and adjusts the duty according to the detected value.

Figure 5:
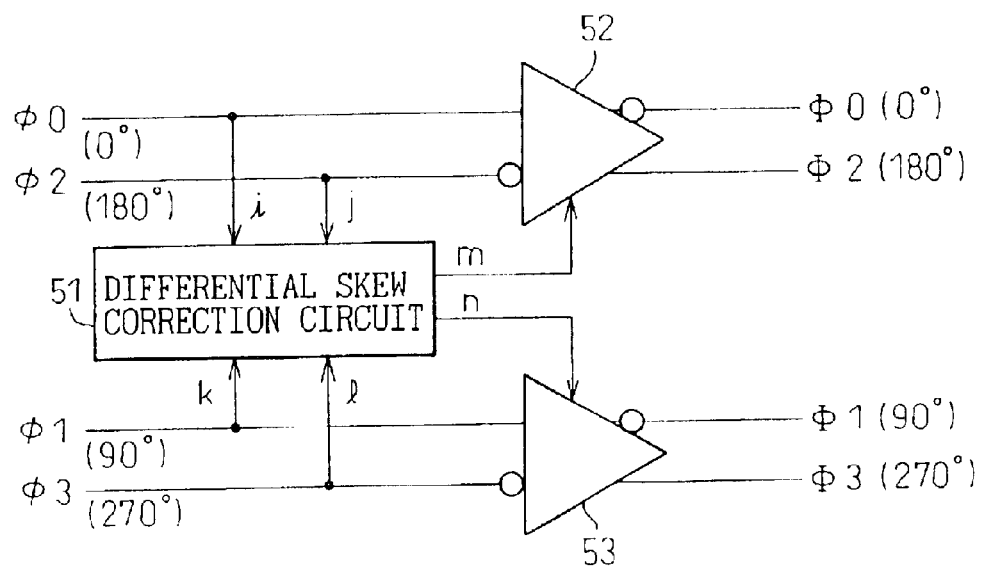
FIG. 5 is a block circuit diagram (part 2) schematically showing the basic functional configuration of the output circuit device according to the present invention.

FIG. 5 is a block circuit diagram (part 2) schematically showing the basic functional configuration of the output circuit device according to the present invention. In FIG. 5, reference numeral 51 is a differential skew correction circuit (duty detection and correction circuit), and 52 and 53 are buffers (buffer circuits). The circuit shown in FIG. 5 can be applied, for example, as the output circuit 1a, 1b shown in FIGS. 3A, 3B.

The duty can be varied effectively by feeding back signals proportional to the outputs of the differential skew correction circuit 51 shown in FIG. 5.

For example, in the transmission of four-phase clocks φ0 to φ3 (multi-phase clocks) spaced 90° apart in phase, as shown in FIG. 5, skew between the complementary (differential) clocks φ0 and φ2 and skew between φ1 and φ3, for example, are detected and fed back to the respective buffer circuits 52 and 53; by so doing, four-phase clocks Φ0 to Φ3 with improved phase uniformity can be generated.

As described above, according to the present invention, an output circuit device (clock buffer) can be provided in which the magnitude of delay is substantially independent of supply voltage variations. Furthermore, an output circuit device can be achieved that provides excellent clock duty and multi-phase uniformity, thus achieving higher-speed signal transmission by reducing static and dynamic timing errors occurring in the clock system.

The preferred embodiments of the output circuit device according to the present invention will be described in detail below with reference to the accompanying drawings.

Figure 6:
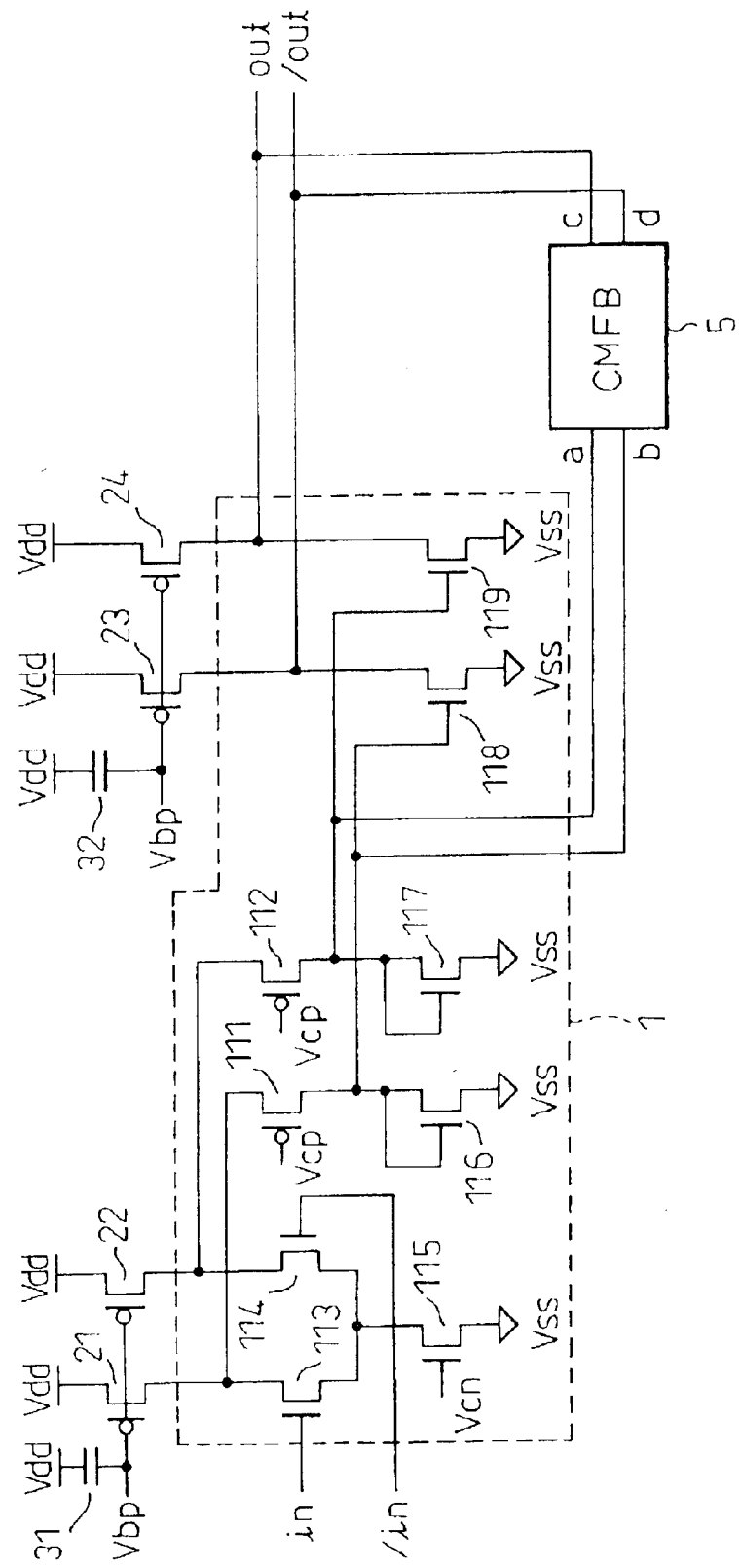
FIG. 6 is a block circuit diagram schematically showing a first embodiment of the output circuit device according to the present invention.

FIG. 6 is a block circuit diagram schematically showing a first embodiment of the output circuit device according to the present invention. In FIG. 6, reference numeral 1 is a circuit proper (output circuit), 21 to 24 are isolating pMOS transistors, 31 and 32 are capacitors, and 5 is a common-mode feedback (CMFB) circuit.

In the circuit proper 1, input signals (input clocks) in and /in are received by an input amplifier circuit comprising an nMOS transistor differential pair 113, 114; the input signals are then transferred via pMOS transistors 111, 112 and nMOS transistors 116, 117, respectively, and output signals (output clocks) out and /out are produced via an output stage amplifier comprising nMOS transistors 118 and 119 respectively connected to the transistors 116 and 117 in a current-mirror configuration. Here, the transistors 111 and 112 are supplied at their gates with a constant voltage Vcp which is lower than the drain potential of the transistors 21 and 22 by a value not smaller than the threshold voltage Vth thereof.

The pMOS transistors 21 to 24 each correspond to the transistor 2a previously shown in FIG. 3A, and act to isolate the circuit proper 1 from the high-level power supply line (Vdd), and the capacitors 31 and 32 each correspond to the capacitor 3a previously shown in FIG. 3A, the former being connected between the high-level power supply line (Vdd) and the gates of the pMOS transistors 21 and 22 and the latter between the high-level power supply line (Vdd) and the gates of the pMOS transistors 23 and 24. This configuration serves to reduce the high-frequency noise occurring in the potential difference between the high-level power supply line Vdd, isolated by the transistors 21 to 24, and the gates of the transistors 21 to 24.

In the first embodiment described above, it is assumed that the high-level supply voltage Vdd is, for example, about 1.2 V, and that the pMOS transistors 21 to 24 forming part of the differential amplifier each correspond to the transistor 2a in FIG. 3A, but in the case of a higher supply voltage (for example, about 3 V), the pMOS transistors in the differential amplifiers may be considered as being included in the circuit proper 1, and the circuit proper 1 may be configured by including additional pMOS transistors (each corresponding to the transistor 2a in FIG. 3A) therein.

Figure 7:
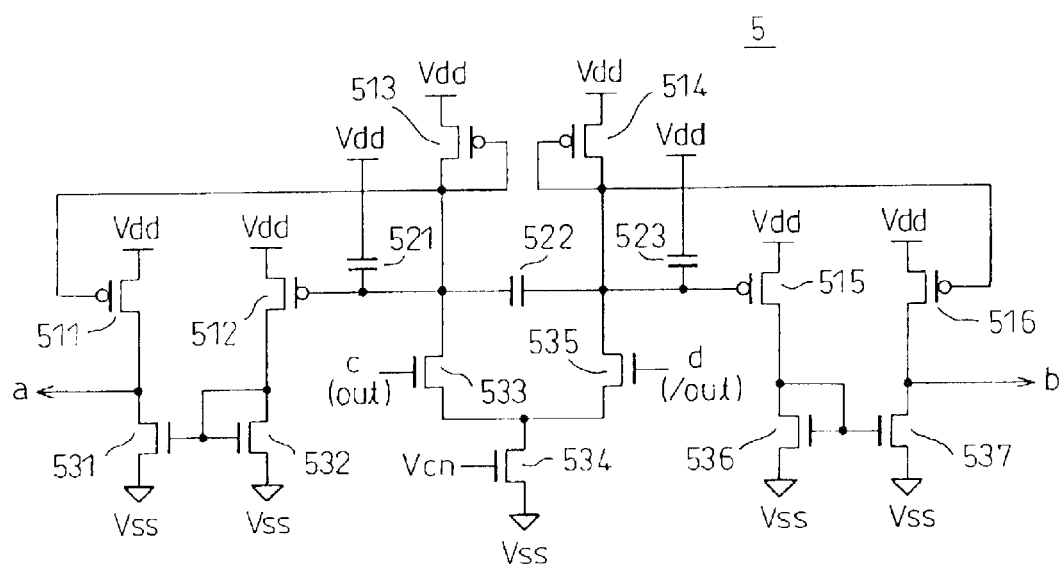
FIG. 7 is a circuit diagram showing one example of a common-mode feedback circuit in the output circuit device of FIG. 6.

FIG. 7 is a circuit diagram showing one example of the common-mode feedback circuit 5 in the output circuit device of FIG. 6.

As shown in FIG. 7, the common-mode feedback (CMFB) circuit 4 comprises pMOS transistors 511 to 516, capacitors 521 to 523, and nMOS transistors 531 to 537. Input signals c and d (the differential output signals out and /out of the output circuit device) are supplied to the nMOS transistor differential pair 533, 535; then, a difference voltage equal to the difference between the DC components of the input signals is generated by the capacitors 522 and 523, and the common-mode voltage of the output signals out and /out is fed back from the outputs (a and b) connected to the gates of the transistors 118 and 119, thereby compensating for the displacement of the duty. That is, the common-mode feedback circuit 5 detects the common-mode voltage of the outputs of the output stage amplifier circuit (transistors 23, 24, 118, and 119), and feeds back current to the input nodes (the gates of the transistors 118 and 119) of the output amplifier circuit so that their values become equal.

Thus, in the first embodiment described above, power supply variations are isolated from the circuit proper 1, and the effect of any residual power supply variation is minimized by causing the common-mode voltage of the signals input to the output stage of the circuit proper to coincide with the steady-state common-mode voltage; by so doing, jitter can be substantially eliminated.

Figure 8:
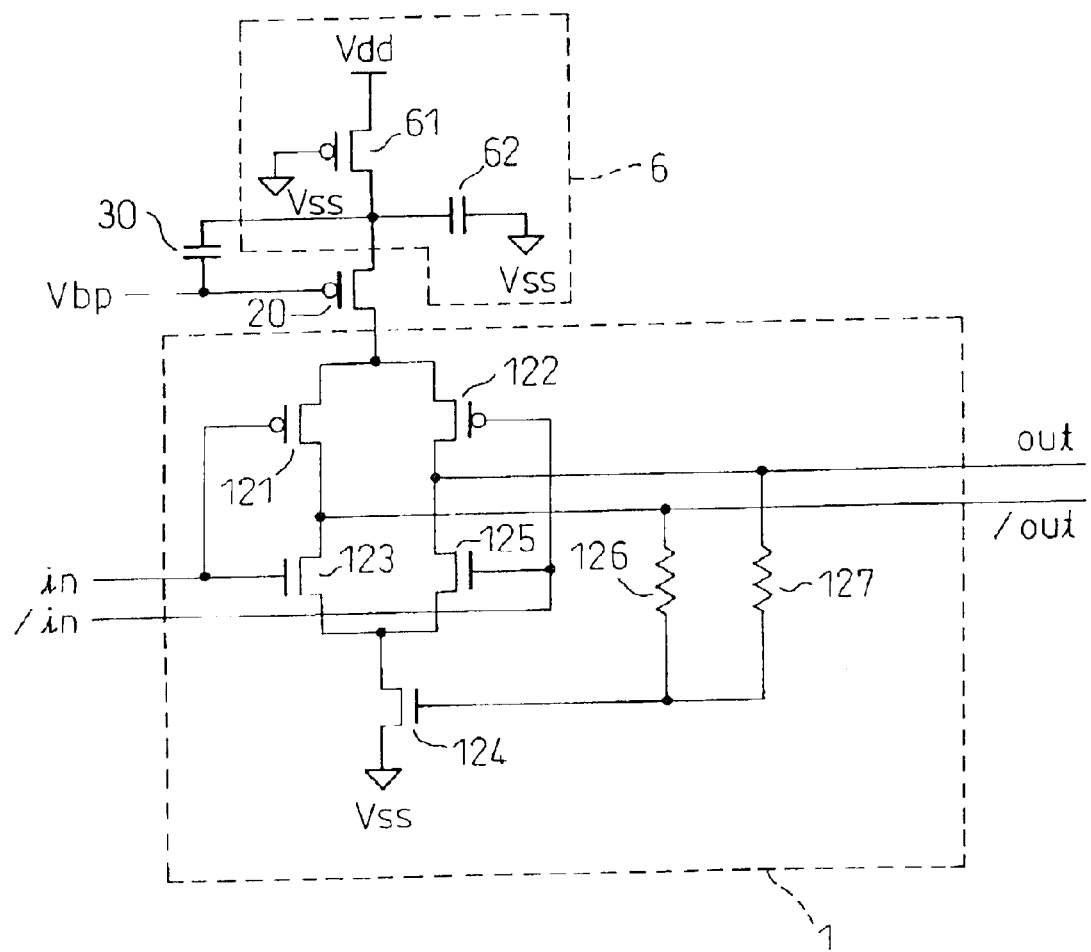
FIG. 8 is a circuit diagram schematically showing a second embodiment of the output circuit device according to the present invention.

FIG. 8 is a circuit diagram schematically showing a second embodiment of the output circuit device according to the present invention.

As shown in FIG. 8, in the output circuit device of the second embodiment, the differential input signals in and /in are supplied to the gates of transistors 121, 123 and transistors 122, 125, respectively, each transistor pair forming a push-pull circuit (inverter). The common source of the pMOS transistors 121 and 122 is connected to the high-level power supply line (Vdd) via an isolating pMOS transistor 20 and a low-pass filter circuit 6, and the gate of the transistor 20 is connected to the drain of a pMOS transistor 61 (the source of the transistor 20) via a capacitor 30. Here, the transistor 20 and the capacitor 30 correspond to the transistor 2a and the capacitor 3a, respectively, previously shown in FIG. 3A. In the second embodiment, however, the capacitor 30, one terminal of which is connected to the gate of the transistor 20, has its other terminal connected to the high-level power supply line (Vdd) not directly, but via the pMOS transistor 61.

In the second embodiment, the common-mode voltage of the output signals is compensated for by feeding back the output signals out and /out to the gate of a transistor 124 via resistors 127 and 126.

The low-pass filter circuit 6 includes a capacitor (filter capacitor) 62 as well as the pMOS transistor (filter transistor) 61 whose gate is supplied with the low-level supply voltage Vss, and the high-frequency noise occurring in the high-level supply voltage Vdd is removed by the low-pass filter circuit 6; then, any remaining noise is isolated from the circuit proper 1 by the constant-current characteristic of the source-grounded pMOS transistor 20.

In this way, according to the output circuit device of the second embodiment, resistance to noise can be further improved by inserting the low-pass filter circuit 6 for the source-grounded transistor (20).

Figure 9:
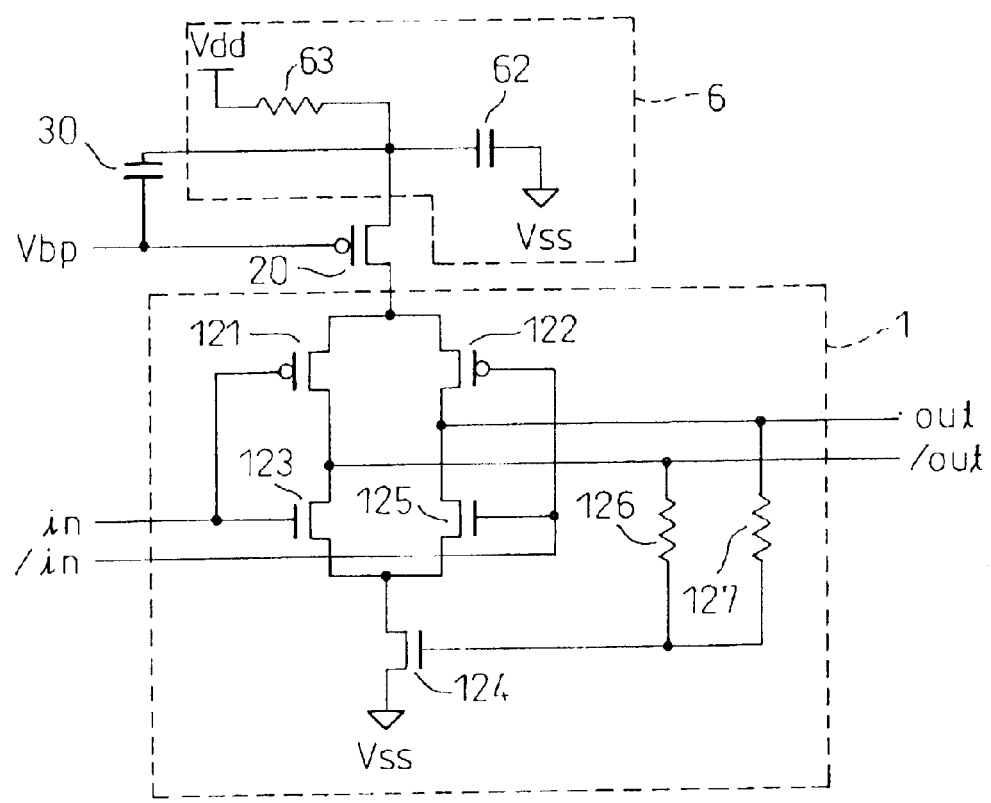
FIG. 9 is a circuit diagram schematically showing a third embodiment of the output circuit device according to the present invention.

FIG. 9 is a circuit diagram schematically showing a third embodiment of the output circuit device according to the present invention.

As is apparent from a comparison between FIG. 9 and FIG. 8, in the output circuit device of the third embodiment, a resistor (filter resistor) 63 is used in place of the pMOS transistor 61 in the low-pass filter circuit 6. Otherwise, the configuration is the same as that of the second embodiment shown in FIG. 8.

Figure 10:
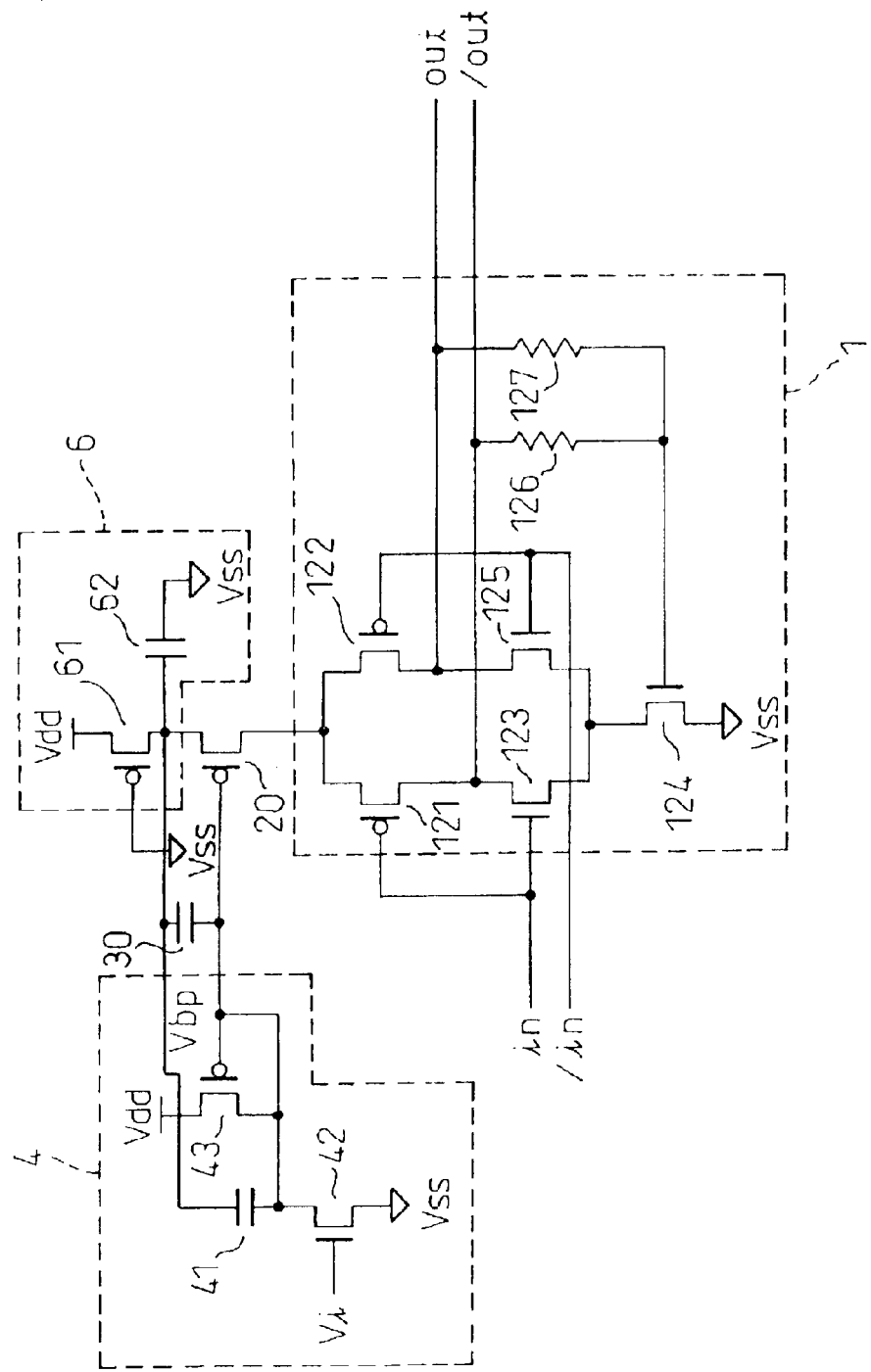
FIG. 10 is a circuit diagram schematically showing a fourth embodiment of the output circuit device according to the present invention.

FIG. 10 is a circuit diagram schematically showing a fourth embodiment of the output circuit device according to the present invention.

As is apparent from a comparison between FIG. 10 and FIG. 8, the output circuit device of the fourth embodiment differs from the output circuit device of the second embodiment by the inclusion of a bias voltage generating circuit 4.

As shown in FIG. 10, the bias voltage generating circuit 4 comprises a capacitor 41, an nMOS transistor 42, and a pMOS transistor 43. The capacitor 41 and the nMOS transistor 42 are connected in series between the low-level power supply line (Vss) and the drain of the pMOS transistor (filter transistor) 61. Here, the gate of the nMOS transistor 42 is supplied, for example, with an output voltage Vi from a buffer that is resistant to a variation in the high-level supply voltage Vdd. The pMOS transistor 43 has its source connected to the high-level power supply line (Vdd) and its gate and drain connected in common to the node between the capacitor 41 and the nMOS transistor 42, and the output bias voltage Vbp is taken from that node.

That is, in the output circuit device of the fourth embodiment, the gate voltage of the pMOS gate-grounded transistor 20 is generated by receiving the current from the nMOS constant-current transistor 42 at the diode-connected pMOS transistor 43. Here, the gate of the pMOS transistor 43 is connected to the capacitors 30 and 41 whose other ends are connected to the drain of the pMOS transistor 61. The high-frequency components of the voltage between the gate of the pMOS transistor 20 and the high-level power supply line (Vdd) are attenuated by the capacitors 30 and 41.

Here, the high-level supply voltage Vdd is, for example, 1.2 V, the low-level supply voltage Vss is 0 V, and the bias voltage Vbp output from the bias voltage generating circuit 4 is, for example, 1.0 V. Of course, these voltage values can be changed variously according to the circuit specification, etc.

According to the output circuit device of the fourth embodiment, since high-frequency noise is not introduced in the gate-source voltage of the pMOS transistor 20, better isolation can be achieved and low jitter characteristics obtained.

Figure 11:
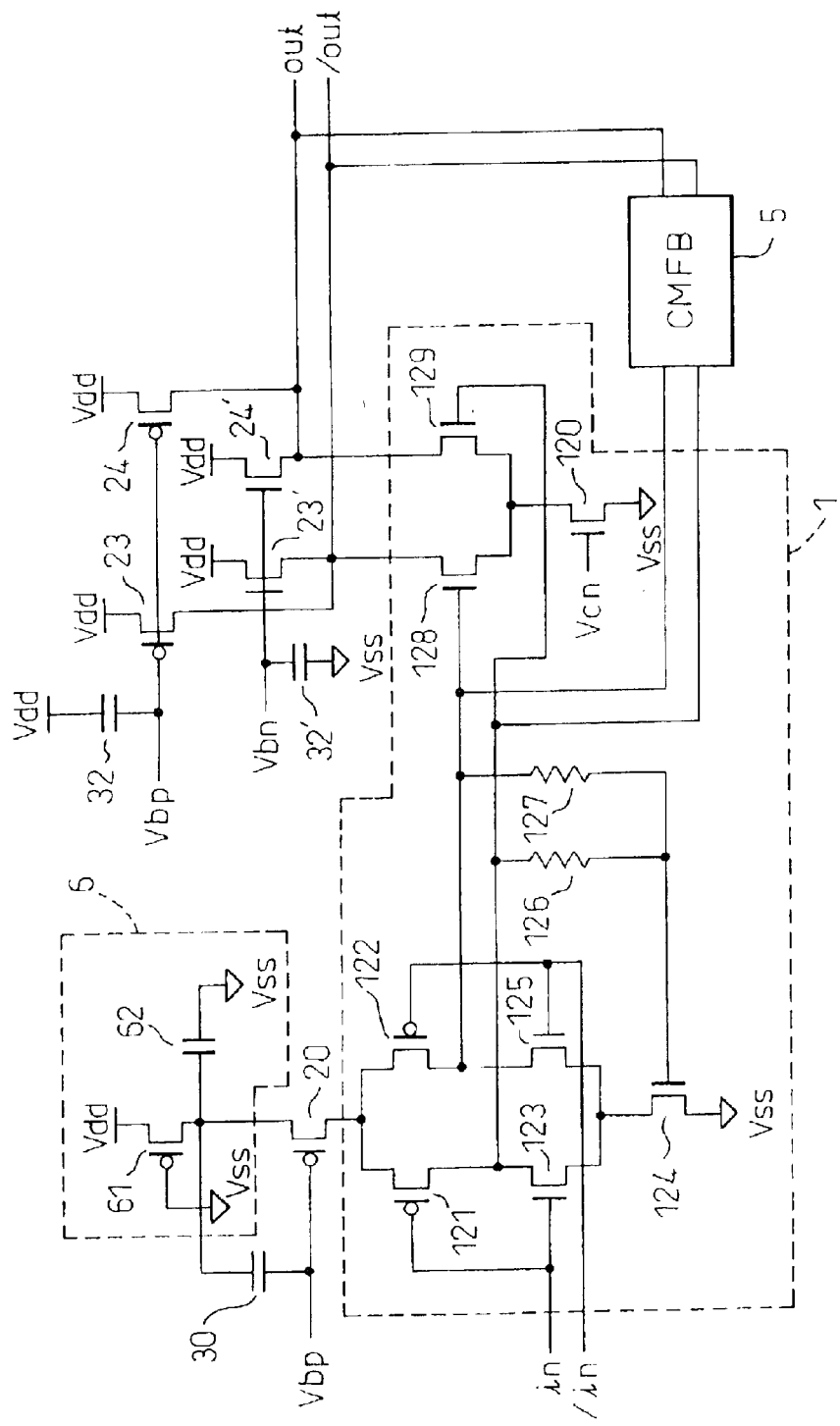
FIG. 11 is a block circuit diagram schematically showing a fifth embodiment of the output circuit device according to the present invention.

FIG. 11 is a block circuit diagram schematically showing a fifth embodiment of the output circuit device according to the present invention.

As is apparent from a comparison between FIG. 11 and FIGS. 6 and 8, in the output circuit device of the fifth embodiment, the circuit of the second embodiment shown in FIG. 8 is used as the first stage amplifier, and a differential amplifier comprising nMOS transistors 23', 24', 120, 128, and 129 is used as the output stage amplifier which amplifies the outputs of the first stage amplifier. That is, the output stage amplifier comprises the differential pair drive transistors 128 and 129, source-follower loads (isolating nMOS transistors) 23' and 24', and current source 120.

Here, as in the second embodiment, the isolating source-grounded pMOS transistor 20 and low-pass filter circuit 6 inserted between the first stage amplifier and the high-level power supply line (Vdd) and the capacitor 30 connected between the gate of the transistor 20 and the drain of the pMOS transistor 61 are provided for the first stage amplifier; with this arrangement, the high-frequency noise in the high-level supply voltage Vdd is sufficiently removed. Further, as in the first embodiment shown in FIG. 6, the isolating source-grounded pMOS transistors 23 and 24 provided between the output stage amplifier (differential-pair transistors 128 and 129) and the high-level power supply line (Vdd) and the capacitor 32 connected between the high-level power supply line (Vdd) and the gates of the transistors 23 and 24 are provided for the output stage amplifier, to remove the high-frequency noise in the high-level supply voltage Vdd, while on the other hand, the high-frequency noise in the low-level supply voltage Vss is removed by the isolating source-follower nMOS transistors 23' and 24' provided between the high-level power supply line (Vdd) and the differential transistor pair 128, 129 and the capacitor 32' connected between the low-level power supply line (Vss) and the gates of the transistors 23' and 24'.

In this way, according to the output circuit device of the fifth embodiment, as the high-frequency noise in both the high-level supply voltage Vdd, and in the low-level supply voltage Vss, can be removed, and as the source-follower nMOS transistors 23' and 24' are used as the differential amplifier in the amplifier stage, a low impedance load is achieved and high-speed, small-amplitude clocks can be generated.

Figure 12:
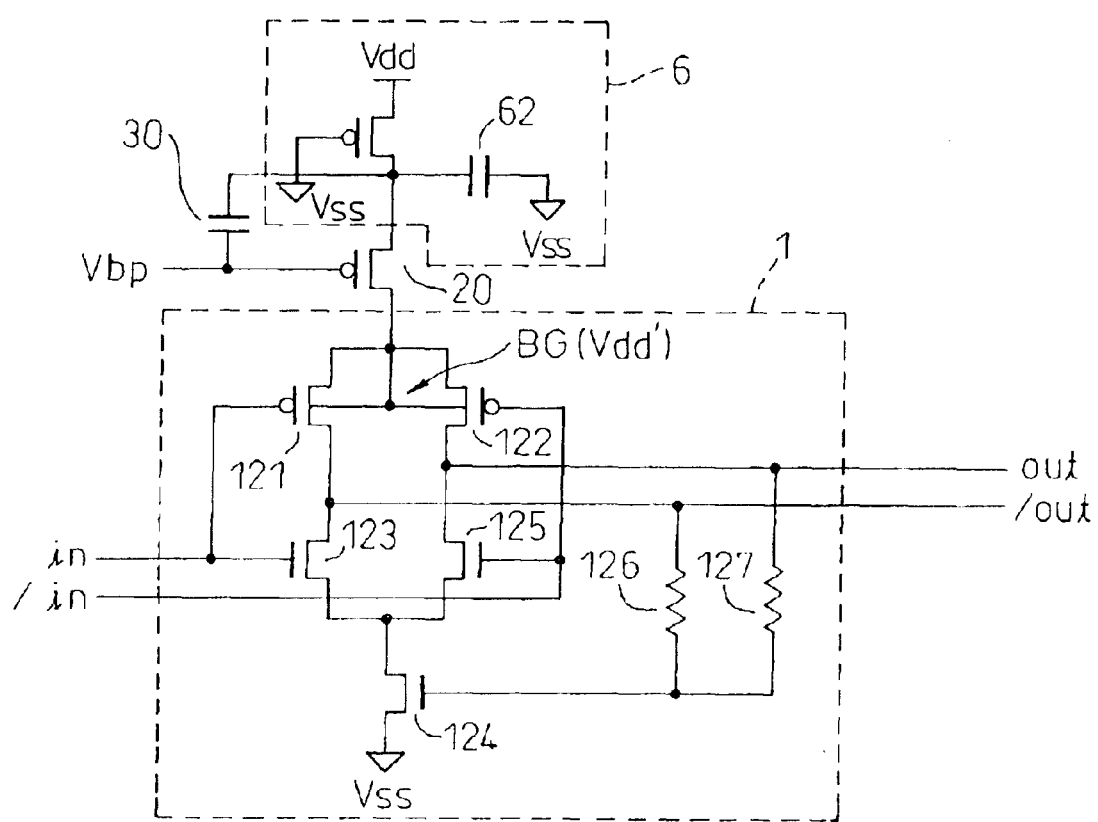
FIG. 12 is a circuit diagram schematically showing a sixth embodiment of the output circuit device according to the present invention.

FIG. 12 is a circuit diagram schematically showing a sixth embodiment of the output circuit device according to the present invention.

As is apparent from a comparison between FIG. 12 and FIG. 8, the output circuit device of the sixth embodiment is similar in circuit configuration to the output circuit device of the second embodiment. However, the output circuit device of the sixth embodiment differs in that the back-gate BG potential (well potential) of the pMOS transistors (differential pair) 121 and 122 is not the high-level supply voltage Vdd, but is the drain voltage of the isolating pMOS transistor 20, that is, the voltage Vdd' obtained by removing the high-frequency noise from the high-level supply voltage Vdd. Accordingly, to the well where the pMOS differential-pair transistors 121 and 122 are formed, is applied the source potential (Vdd') of the differential-pair transistors 121 and 122, thus removing the power supply noise introduced through the well of these transistors 121 and 122.

Figure 13:
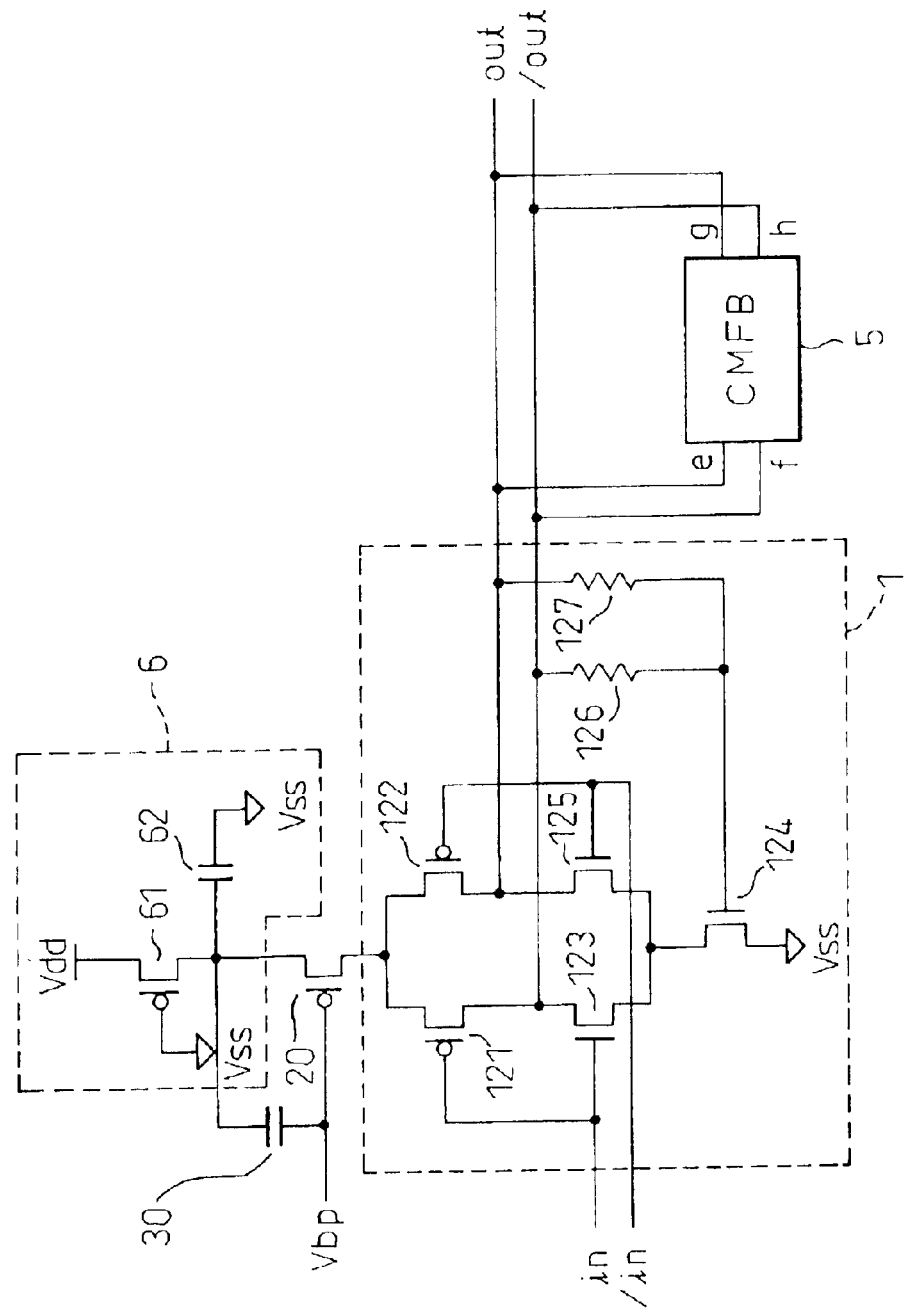
FIG. 13 is a block circuit diagram schematically showing a seventh embodiment of the output circuit device according to the present invention.
Figure 14:
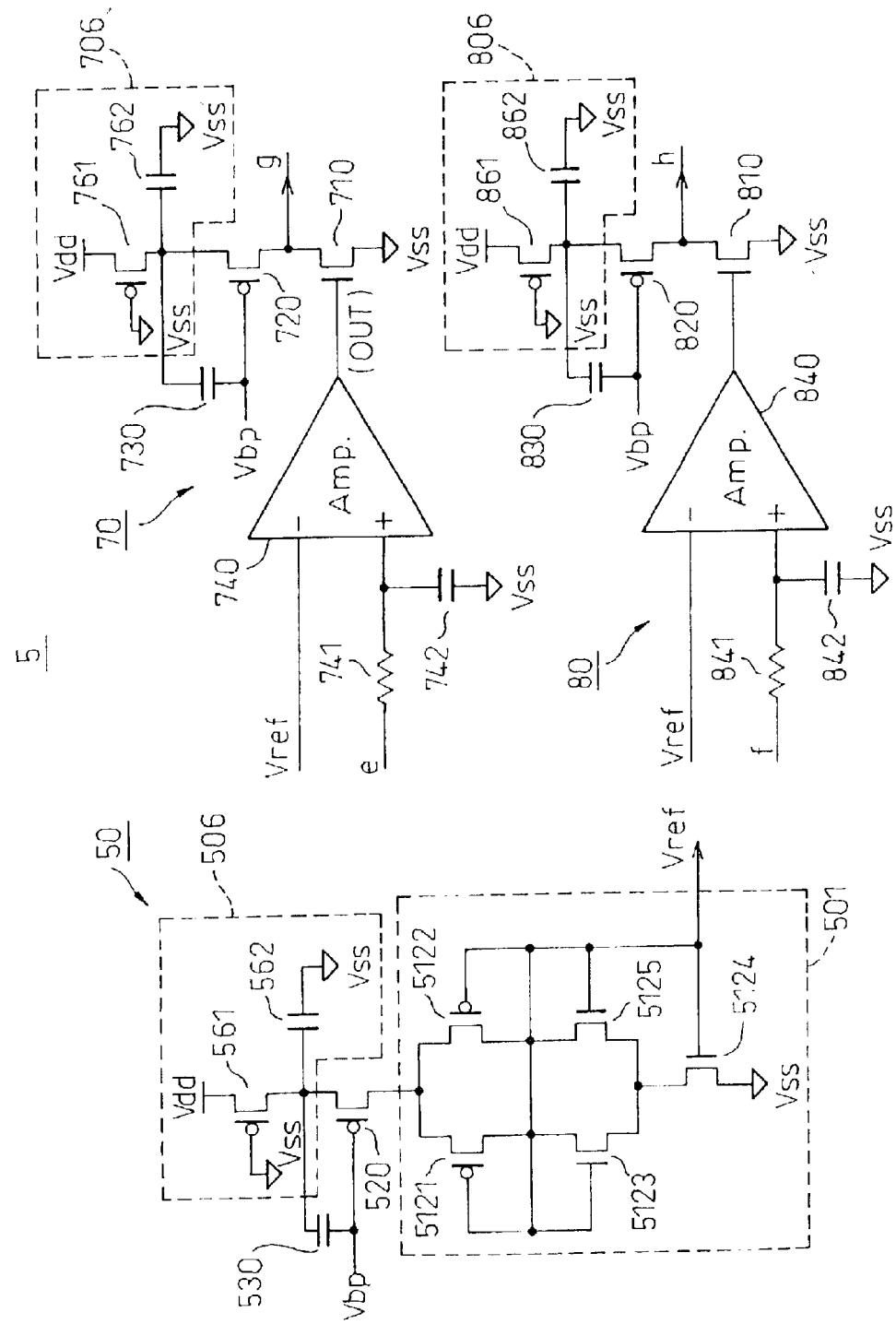
FIG. 14 is a circuit diagram showing one example of a common-mode feedback circuit in the output circuit device of FIG. 13.

FIG. 13 is a block circuit diagram schematically showing a seventh embodiment of the output circuit device according to the present invention, and FIG. 14 is a block circuit diagram showing one example of the common-mode feedback circuit in the output circuit device of FIG. 13.

As is apparent from a comparison between FIG. 13 and FIG. 8, the output circuit device of the seventh embodiment differs from the output circuit device of the second embodiment by the inclusion of the common-mode feedback circuit 5. The common-mode feedback circuit 5 comprises, as shown in FIG. 14, a replica circuit 50, which generates a common-mode reference voltage Vref, and amplifiers 70 and 80, which control the common-mode voltage of the output signals by comparing the voltage levels of the output signals out and/out with the reference voltage Vref.

The replica circuit 50 has a configuration (circuit proper 501, isolating source-grounded pMOS transistor 520, capacitor 530, and filter circuit 506) essentially similar to the output circuit device (circuit proper 1, isolating source-grounded pMOS transistor 20, capacitor 30, and filter circuit 6). However, in the replica circuit 50, the gates of the transistors 5121 to 5125 and the drains of the transistors 5121 to 5123 and 6125 are connected together to a common node, and the reference voltage Vref is taken from that common node. The filter circuit 506 in the replica circuit 50 comprises a pMOS transistor 561 and a capacitor 562, similarly to the filter circuit 6.

The amplifiers 70 and 80 are identical in configuration, that is, each amplifier 70 (80) comprises: an amplifier circuit 740 (840), which differentially amplifies the reference voltage Vref and a signal e (f) input via a low-pass filter comprising a resistor 741 (841) and a capacitor 742 (842); a filter circuit 706 (806) having a pMOS transistor 761 (861) and a capacitor 762 (862); an isolating source-grounded pMOS transistor 720 (820); a capacitor 730 (830); and nMOS drive transistor 710 (810).

Figure 15:
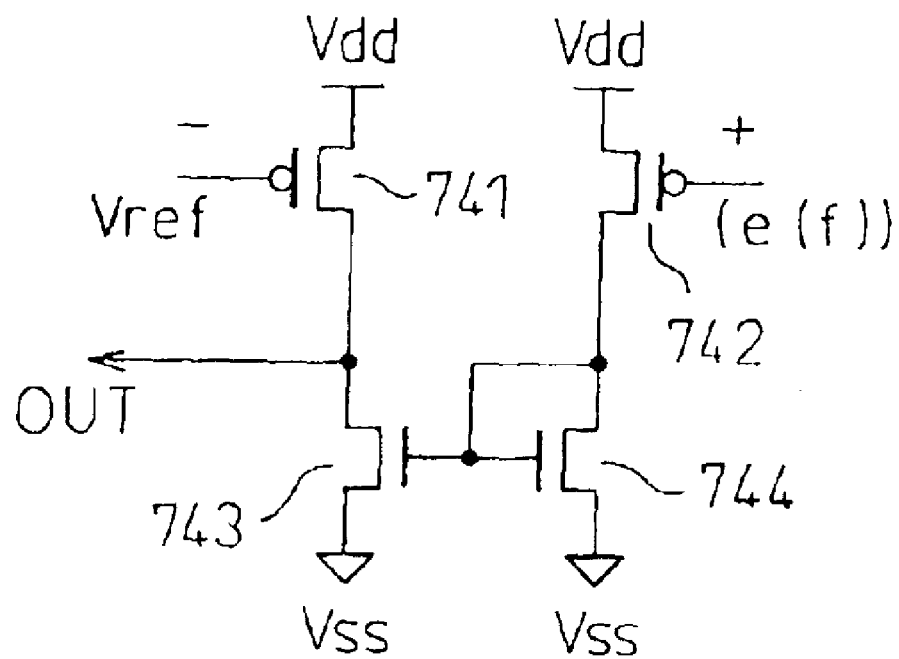
FIG. 15 is a circuit diagram showing one example of a differential amplifier circuit in the common-mode feedback circuit of FIG. 14.

FIG. 15 is a circuit diagram showing one example of the differential amplifier circuit 740 (840) in the common-mode feedback circuit of FIG. 14.

As shown in FIG. 15, the differential amplifier circuit 740 comprises pMOS differential-pair transistors 741 and 742, to which the reference voltage Vref and the signal e input via the low-pass filter, respectively, are applied, and nMOS load transistors 743 and 744.

As described above, according to the output circuit device of the seventh embodiment, the reference voltage Vref, generated by the replica circuit 50 having a configuration (circuit proper 501, isolating source-grounded pMOS transistor 520, capacitor 530, and filter circuit 506) essentially similar to the output circuit device (circuit proper 1, isolating source-grounded pMOS transistor 20, capacitor 30, and filter circuit 6), is compared with the common mode of the output signals out and /out (e and f), and the results of the comparisons are fed back (g and h) to the output signals, so that control can be performed so as to cause the common-mode voltage level of the output signals out and /out to substantially coincide with the reference voltage Vref. Further, in the seventh embodiment, since the common-mode feedback is performed only on the output side of the output circuit device, it is possible to construct the amplifier stage as a single stage amplifier.

Figure 16:
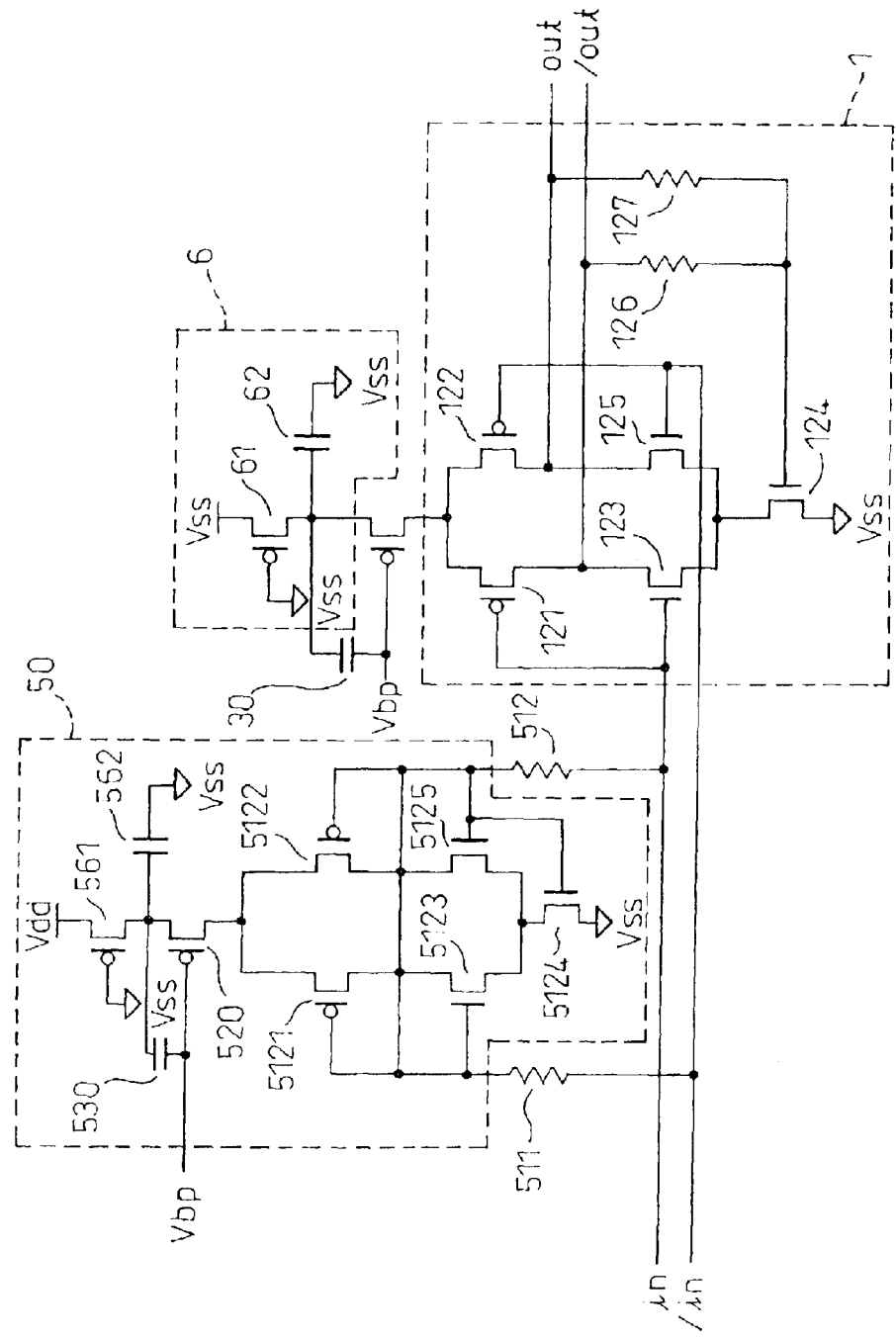
FIG. 16 is a circuit diagram schematically showing an eighth embodiment of the output circuit device according to the present invention.

FIG. 16 is a circuit diagram schematically showing an eighth embodiment of the output circuit device according to the present invention.

As is apparent from a comparison between FIG. 16 and FIGS. 8 (13) and 14, in the output circuit device of the eighth embodiment, a circuit (common-mode voltage generating circuit) similar to the replica circuit 50 in FIG. 14 is provided for a single-stage amplifier circuit similar to the one in the second embodiment of FIG. 8, and the input signals in and /in are supplied via resistors 511 and 512 to the gates of the differential-pair transistors 5121, 5122 and 5123, 5125, that is, the differential input signals in and /in are terminated in the common-mode voltage generating circuit 50 via the resistors 511 and 512. As a result, the common-mode voltage of the input signals in and /in is brought close in value to the output voltage of the common-mode voltage generating circuit 50 (the reference voltage Vref of the replica circuit).

Compared with the common-mode feed back type, the output circuit device of the eighth embodiment is superior in terms of the frequency characteristic of the common-mode voltage variation suppression circuit. That is, while the common-mode feedback necessarily entails a delay through the feedback amplifier circuit, in the eighth embodiment the fluctuation in delay associated with the feedback can be eliminated because the common-mode voltage is controlled by a termination that does not involve feedback.

Figure 17:
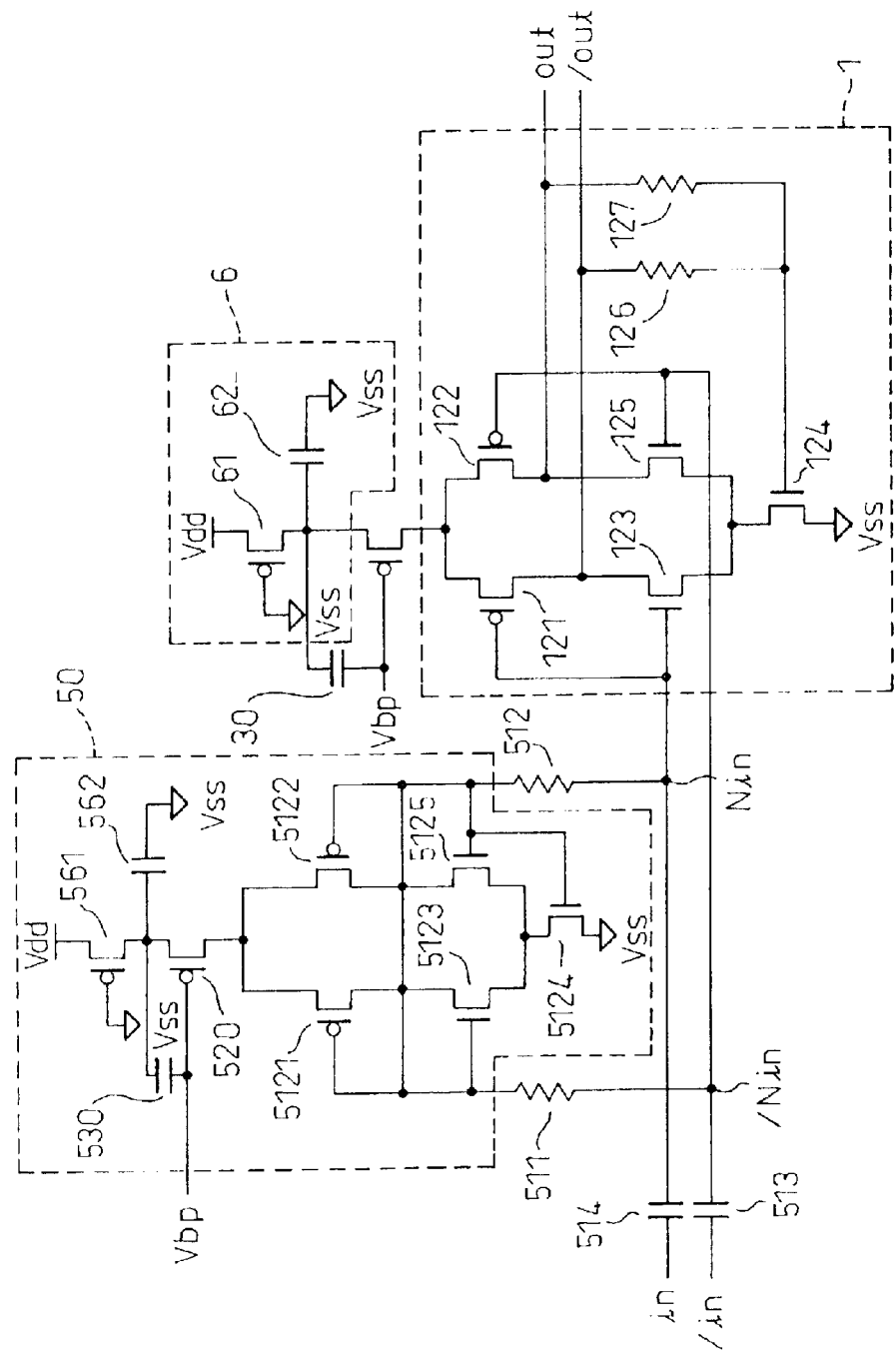
FIG. 17 is a circuit diagram schematically showing a ninth embodiment of the output circuit device according to the present invention.

FIG. 17 is a circuit diagram schematically showing a ninth embodiment of the output circuit device according to the present invention.

As is apparent from a comparison between FIG. 17 and FIG. 16, the output circuit device of the ninth embodiment differs from the output circuit device of the eighth embodiment by the inclusion of capacitors 513 and 514 for AC coupling on the input side. Here, nodes Nin and /Nin on the AC-coupled input side of the output circuit are supplied with a bias voltage (reference voltage Vref) from the common-mode voltage generating circuit (replica circuit) 50 shown in FIG. 16.

Since the input common-mode voltage can be supplied to the output circuit device independently of the common-mode voltage of the input signals in and /in, the output circuit device of the ninth embodiment has the advantage that, when the output circuit device is applied, for example, to a configuration where the signals propagate through multi-stage clock buffers, variations in the common-mode voltage can be completely suppressed.

Figure 18:
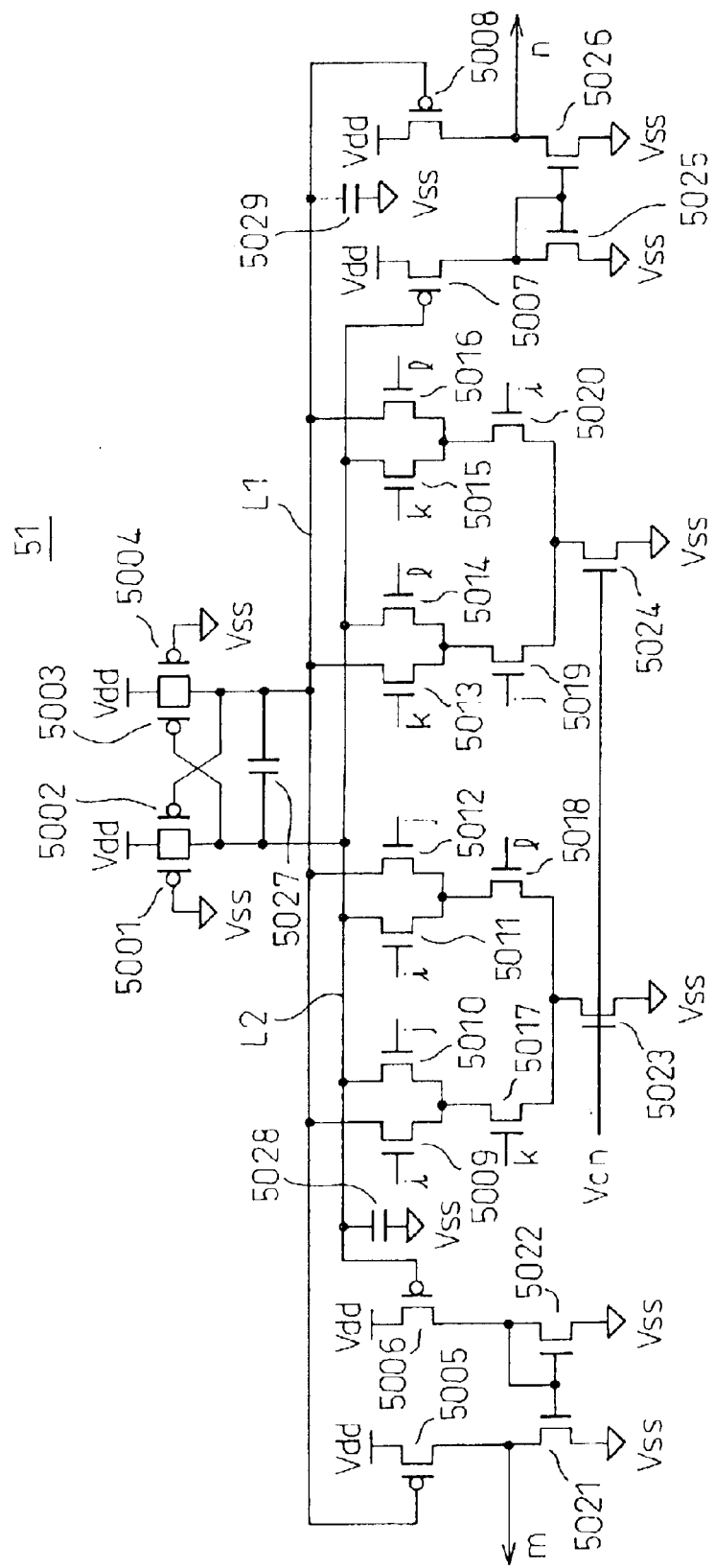
FIG. 18 is a circuit diagram showing one example of a differential skew correction circuit in the output circuit device of FIG. 5 as a 10th embodiment according to the present invention.

FIG. 18 is a circuit diagram showing one example of the differential skew correction circuit 51 in the output circuit device of FIG. 5 as a 10th embodiment according to the present invention, in which a duty (duty cycle) detection circuit and correction circuit (feedback nMOS transistors 5009 to 5020) are provided at the output of the buffer.

As previously described, the circuit shown in FIG. 5 can be applied, for example, as the output circuit 1a, 1b shown in FIGS. 3A, 3B, and the embodiment shows an example as applied to a clock buffer for transmitting four-phase clocks φ0 to φ3 spaced 90° apart in phase.

As shown in FIGS. 5 and 18, in the output circuit device of the 10th embodiment, a complementary (differential) pair of clocks φ0 (clock of 0° phase: i) and φ2 (clock of 180° phase: j) and a complementary pair of clocks φ1 (clock of 90° phase: k) and φ3 (clock of 270° phase: l) are input to the differential skew correction circuit 51, and skew between φ0 and φ2 and skew between φ1 and φ3 are detected and fed back to the respective buffer circuits 52 and 53, thereby generating four-phase clocks Φ0 to Φ3 having improved phase uniformity.

That is, the differential skew correction circuit 51 comprises pMOS transistors 5001 to 5008, nMOS transistors 5009 to 5026, and capacitors 5027 to 5029. The differential inputs i and j (clocks φ0 and φ2) are supplied to the gates of the differential-pair transistors 5009 and 5010, 5011 and 5012, and 5020 and 5019, respectively, while the differential inputs k and l (clocks φ1 and φ3) are supplied to the gates of the differential-pair transistors 5013 and 5014, 5015 and 5016, and 5017 and 5018, respectively.

During the high level "H" and low level "L" periods of the respective input signals i, j, k, and l, signals m and n created by combinations of the capacitors 5027 to 5029 connected to signal lines L1 and L2 are output via the pMOS transistors 5005, 5006 and 5008, 5007, respectively, whose gates are connected to the respective signal lines L1 and L2. By controlling the buffer circuits 52 and 53 using these signals m and n, the duty between the respective clock pairs φ0, φ2 and φ1, φ3 is adjusted to or near 50%, while performing feedback so as to maintain the 90° phase difference between the respective four clocks φ0 to φ3, thereby outputting the four-phase clocks φ0 to φ3 having accurate phase spacing.

The output circuit device of the 10th embodiment is preferable as a clock buffer to be used, for example, in a timing generating circuit that requires multi-phase clocks with accurate phase spacing.

Figure 19:
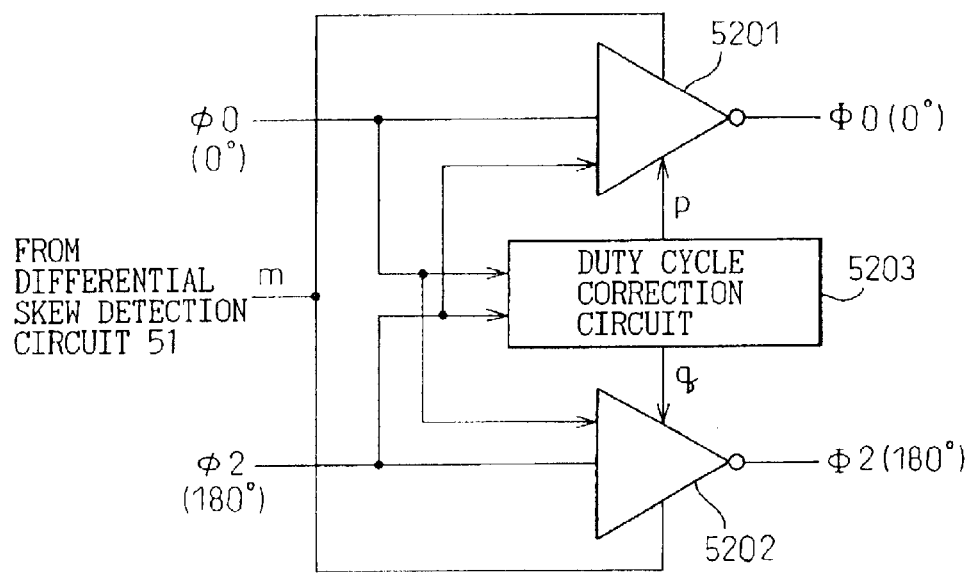
FIG. 19 is a circuit diagram showing one example of a buffer circuit in the output circuit device of FIG. 5 as an 11th embodiment according to the present invention.

FIG. 19 is a circuit diagram showing one example of the buffer circuit 52 in the output circuit device of FIG. 5 as an 11th embodiment according to the present invention.

As shown in FIG. 19, in the output circuit device of the 11th embodiment, the complementary (differential) pair of clocks φ0 (clock of 0° phase) and φ2 (clock of 180° phase), for example, are supplied to buffers 5201 and 5202 as well as to a duty cycle correction circuit 5203. The duty cycle correction circuit 5203 detects and compares the duty cycles (high level "H" and low level "L" periods) of the clocks φ0 and φ2, and supplies control signals p and q to the buffers 5201 and 5202 to apply corrections so that the duty cycles of the clocks φ0 and φ2 become equal to each other. Here, the output (m) of the earlier described differential skew correction circuit 51 is supplied to the buffers 5201 and 5202, and the skew between the input clocks φ0 and φ2, detected and corrected by the differential skew correction circuit 51, is fed back to the buffers 5201 and 5202, to generate the clocks Φ0 and Φ2 having improved phase uniformity.

Figure 20:
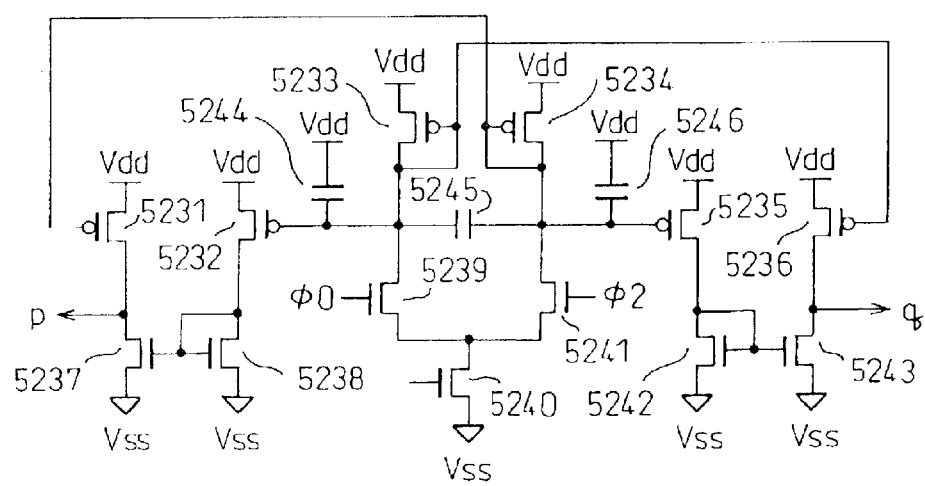
FIG. 20 is a circuit diagram showing one example of a duty cycle correction circuit in the buffer circuit of FIG. 19.

FIG. 20 is a circuit diagram showing one example of the duty cycle correction circuit 5203 in the buffer circuit of FIG. 19.

As shown in FIG. 20, the duty cycle correction circuit 5203 comprises pMOS transistors 5231 to 5236, nMOS transistors 5237 to 5243, and capacitors 5244 to 5246. The duty cycle correction circuit 5203 detects and corrects the skew between the input clocks φ0 and φ2, and feeds back the control signal p (q) to the buffer 5201 (5202) to generate the clocks Φ0 and Φ2 with improved phase uniformity.

According to the output circuit device of the 11th embodiment, the duty of each clock Φ0, Φ2 can be adjusted to or near 50% at all times, which serves to prevent a pulse from gradually diminishing in width and eventually disappearing while the clock is propagating, for example, through multi-stage clock buffers.

In the above description, the output circuit device of the present invention is not limited to a clock buffer to be used for clock distribution, but can be applied to various buffers that require high-speed operation with accurate timing. Furthermore, the output circuit device of the present invention is applicable not only to two-phase (differential) and four-phase signals, but also to eight-phase or other multi-phase signals (for example, multi-phase clocks); for example, an output circuit system can be constructed that maintains constant phase spacing between multiple phases by adjusting the amount of delay in each output circuit device in accordance with an output of a uniformity detection circuit that detects phase uniformity between multi-phase clocks.

As described in detail above, according to the present invention, an output circuit device can be provided that can minimize jitter and can operate at high speed with accurate timing.

Many different embodiments of the present invention may be constructed without departing from the spirit and scope of the present invention, and it should be understood that the present invention is not limited to the specific embodiments described in this specification, except as defined in the appended claims.

What is claimed is:

1. An output circuit device comprising an output circuit having a plurality of buffer circuit connected to a first power supply line and a second power supply line via a corresponding control circuit having at least one isolating transistor, wherein
   a control voltage held at a constant level is applied to a control electrode of said isolating transistor, and
   said control voltage is a voltage at a level that works to attenuate high frequency components contained in a voltage supplied from said first or said second power supply line.

2. The output circuit device as claimed in claim 1, wherein said control circuit comprises a high frequency component attenuating capacitor one end of which is connected to the control electrode of said isolating transistor.

3. The output circuit device as claimed in claim 2, wherein said isolating transistor is a source-grounded MOS transistor, and
   the other end of said high-frequency component attenuating capacitor is connected to a source side of said first or said second power supply line whichever is connected to said source grounded MOS transistor.

4. The output circuit device as claimed in claim 3, wherein said isolating transistor is a pMOS transistor whose source is connected to said first power supply line, and whose drain is connected to said output circuit, and the other end of said high frequency component attenuating capacitor is connected to said first power supply line.

5. The output circuit device as claimed in claim 3, wherein said isolating transistor is an nMOS transistor whose source is connected to said second power supply line, and whose drain is connected to said output circuit, and
   the other end of said high-frequency component attenuating capacitor is connected to said second power supply line.

6. The output circuit device as claimed in claim 2, wherein said isolating transistor is a source follower connected MOS transistor, and
   the other end of said high frequency component attenuating capacitor is connected either to said first or said second power supply line, whichever is not connected to said source follower connected MOS transistor, or to a node having a prescribed potential difference relative to said power supply line not connected to said source follower connected MOS transistor.

7. The output circuit device as claimed in claim 6, wherein said isolating transistor is an nMOS transistor whose source is connected to said output circuit, and whose drain is connected to said first power supply line, and
   the other end of said high frequency component attenuating capacitor is connected to said second power supply line.

8. The output circuit device as claimed in claim 6, wherein said isolating transistor is a pMOS transistor whose source is connected to said output circuit, and whose drain is connected to said second power supply line, and
   the other end of said high frequency component attenuating capacitor is connected to said first power supply line.

9. The output circuit device as claimed in claim 1, wherein said control voltage is generated through a noise reduction filter circuit, and
   said noise reduction filter circuit attenuates the high frequency components contained in the voltage supplied from said first or said second power supply line whichever is connected to said isolating MOS transistor.

10. The output circuit device as claimed in claim 1, wherein
    said output circuit comprises a pair of inverters amplifying differential signals, and
    a voltage passed through said control circuit is applied to a back gate of a transistor forming each of said inverters.

11. The output circuit device as claimed in claim 10, wherein a well of each pMOS transistor forming said pair of inverters is connected to the source of said pMOS transistor.

12. The output circuit device as claimed in claim 1, wherein said isolating transistor is provided on at least one side of either between said output circuit and said first power supply line or between said output circuit and said second power supply line.

13. The output circuit device as claimed in claim 12, wherein said isolating transistor is provided on both sides of between said output circuit and said first power supply line and between said output circuit and said second power supply line.

14. The output circuit device as claimed in claim 1, further comprising a low pass filter circuit provided in series to said isolating transistor.

15. The output circuit device as claimed in claim 14, wherein said low pass filter circuit comprises:
- a filter transistor connected in series between said isolating transistor and said first or said second power supply line; and
- a filter capacitor one end of which is connected to a connection node between said isolating transistor and said filter transistor.

16. The output circuit device as claimed in claim 15, wherein a potential on said first or said second power supply line, whichever is not connected to said filter transistor, is applied to a control electrode of said filter transistor as well as to the other end of said filter capacitor.

17. The output circuit device as claimed in claim 14, wherein said low pass filter circuit comprises:
- a filter resistor connected in series between said isolating transistor and said first or said second power supply line; and
- a filter capacitor one end of which is connected to a connection node between said isolating transistor and said filter resistor.

18. The output circuit device as claimed in claim 17, wherein a potential on said first or said second power supply line, whichever is not connected to said filter resistor, is applied to the other end of said filter capacitor.

19. The output circuit device as claimed in claim 1, further comprising:
- a duty detection circuit detecting an output duty of said output circuit; and
- a duty adjusting circuit adjusting the output duty of said output circuit in accordance with said detected duty, and wherein the ratio of said output duty is controlled to approximately 50%.

20. The output circuit device as claimed in claim 1, wherein said output circuit device is a clock buffer used for clock signal distribution.

21. An output circuit system having a plurality of output circuit devices, multi phase clocks being transmitted through said plurality of output circuit devices, and phase spacing between multiple phases being maintained constant by adjusting the amount of delay in each of said output circuit devices in accordance with an output of a uniformity detection circuit that detects phase uniformity between said multi phase clocks, wherein each of said output circuit devices comprises an output circuit connected between a first power supply line and a second rower supply line via a control circuit having at least one isolating transistor, wherein
- a control voltage held at a constant level is applied to a control electrode of said isolating transistor, and
- said control voltage is a voltage at a level that works to attenuate high frequency components contained in a voltage supplied from said first or said second power supply line.

22. An output circuit device comprising:
- an output circuit having a plurality of buffer circuits connected to a first power supply line or a second power supply line via a corresponding control circuit having at least one isolating transistor; and
- a plurality of bias voltage generating circuits, corresponding to each of said plurality of buffer circuits, for supplying a control voltage having a constant level to a control electrode of said isolating transistor, said control voltage being a voltage at a level that works to attenuate high-frequency components contained in a voltage supplied from said first or said second power supply line.

23. An output circuit system having a plurality of output circuit devices, mufti-phase clocks being transmitted through said plurality of output circuit devices, and phase spacing between multiple phases being maintained constant by adjusting the amount of delay in each of said output circuit devices in accordance with an output of a uniformity detection circuit that detects phase uniformity between said mufti phase clocks, wherein each of said output circuit devices comprises an output circuit having a plurality of buffer circuits connected to a first power supply line or a second power supply line via a corresponding control circuit having at least one isolating transistor, wherein
- a control voltage field at a constant level is applied to a control electrode of said isolating transistor, and
- said control voltage is a voltage at a level that works to attenuate high-frequency components contained in a voltage supplied from said first or said second power supply line.

24. An output circuit system having a plurality of output circuit devices, multi-phase clocks being transmitted through said plurality of output circuit devices, and phase spacing between multiple phases being maintained constant by adjusting the amount of delay in each of said output circuit devices in accordance with an output of a uniformity detection circuit that detects phase uniformity between said multi-phase clocks, wherein each of said output circuit devices comprises:
- an output circuit having a plurality of buffer circuits connected to a first power supply line or a second power supply line via a corresponding control circuit having at least one isolating transistor; and
- a plurality of bias voltage generating circuits, corresponding to each of said plurality of buffer circuits, for supplying a control voltage having a constant level to a control electrode of said isolating transistor, said control voltage being a voltage at a level that works to attenuate high frequency component contained in a voltage supplied from said first or said second power supply line.

* * * * *